United States Patent
Khan et al.

(10) Patent No.: US 12,145,858 B1
(45) Date of Patent: *Nov. 19, 2024

(54) MESOSCOPIC INVERTED PEROVSKITE SOLAR CELL

(71) Applicant: KING FAHD UNIVERSITY OF PETROLEUM AND MINERALS, Dhahran (SA)

(72) Inventors: Firoz Khan, Dhahran (SA); Masoud Al-Rasheidi, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

This patent is subject to a terminal disclaimer.

(21) Appl. No.: 18/796,390

(22) Filed: Aug. 7, 2024

Related U.S. Application Data

(63) Continuation of application No. 18/490,839, filed on Oct. 20, 2023, now Pat. No. 12,110,235, which is a
(Continued)

(51) Int. Cl.
*H01B 1/08* (2006.01)
*C01G 51/00* (2006.01)
(Continued)

(52) U.S. Cl.
CPC ............... *C01G 51/40* (2013.01); *H01B 1/08* (2013.01); *H10K 85/50* (2023.02); *C01P 2002/72* (2013.01); *C01P 2004/03* (2013.01); *C01P 2004/04* (2013.01); *C01P 2004/22* (2013.01); *C01P 2004/61* (2013.01); *C01P 2004/62* (2013.01); *C01P 2004/64* (2013.01); *C01P 2004/90* (2013.01); *C01P 2006/40* (2013.01); *C01P 2006/90* (2013.01);
(Continued)

(58) Field of Classification Search
CPC . H01B 1/00; H01B 1/08; H10K 30/50; H10K 30/85; H01L 31/0264; H01L 31/0268; C01G 51/40
See application file for complete search history.

(56) References Cited

U.S. PATENT DOCUMENTS

| | | | |
|---|---|---|---|
| 5,198,025 A | 3/1993 | Dausch | |
| 7,115,213 B2 | 10/2006 | Yoshida | |
| 8,241,531 B2 | 8/2012 | Yu | |
| 10,442,736 B2 | 10/2019 | Okochi | |
| 11,258,030 B2 | 2/2022 | Wu | |

FOREIGN PATENT DOCUMENTS

| | | |
|---|---|---|
| CN | 109994621 A | 7/2019 |
| CN | 108767132 B | 12/2019 |

(Continued)

OTHER PUBLICATIONS

Meng et al "Recent Advances in the Inverted Planar Structure of Perovskite Solar Cells", Acc. Chem. Res. 2016, 49, 155-165.*
(Continued)

*Primary Examiner* — Mark Kopec
(74) *Attorney, Agent, or Firm* — Oblon, McClelland, Maier & Neustadt, L.L.P.

(57) ABSTRACT

An electron transport includes a metal co-doped zinc oxide compound having a formula $Mn_xCo_{0.015}Zn_{1-x}O$, wherein x has a value in a range of 0.001 to 0.014. The electron transport material of the present disclosure may be used in a perovskite solar cell.

19 Claims, 17 Drawing Sheets

Related U.S. Application Data continuation of application No. 18/335,701, filed on Jun. 15, 2023, now Pat. No. 11,827,528.

(51) Int. Cl.
  *H10K 30/50* (2023.01)
  *H10K 85/50* (2023.01)
  *H10K 30/85* (2023.01)
  *H10K 71/15* (2023.01)

(52) U.S. Cl.
  CPC ............ *H10K 30/50* (2023.02); *H10K 30/85* (2023.02); *H10K 71/15* (2023.02)

(56) References Cited

FOREIGN PATENT DOCUMENTS

| | | |
|---|---|---|
| CN | 109390476 B | 11/2020 |
| CN | 114695708 A | 7/2022 |

OTHER PUBLICATIONS

Yao et al "A copper-doped nickel oxide bilayer for enhancing efficiency and stability of hysteresis-free inverted mesoporous perovskite solar cells", Nano Energy 40 (2017) 155-162.*
Wojnarowicz et al ; Structural and Magnetic Properties of Co—Mn Codoped ZnO Nanoparticles Obtained by Microwave Solvothermal Synthesis ; MDPI Crystals 8 ; Oct. 31, 2018 ; 28 Pages.
Li et al. ; Magnetic behavior of Co—Mn co-doped Zno nanoparticles ; Journal of Magnetism and Magnetic Materials, vol. 372 ; 3 Pages.
Sharma et al "Transition metal (Co, Mn) co-doped ZnO nanoparticles: Effect on structural and optical properties", Journal of Alloys and Compounds 698 (2017) 532e538.
Abdullahi et al "Synthesis and characterization of Mn and Co codoped ZnO nanoparticles", Superlattices and Microstructures 83 ( 2015) 342-352.
Yin-Hua et al "Infrared emissivities of Mn, Co co-doped ZnO powders", Chin. Phys. B vol. 21, No. 12 (2012) 124205.
Noh et al "The architecture of the electron transport layer for a perovskite solar cell", J. Mater. Chem. C, 2018, 6,682.

* cited by examiner

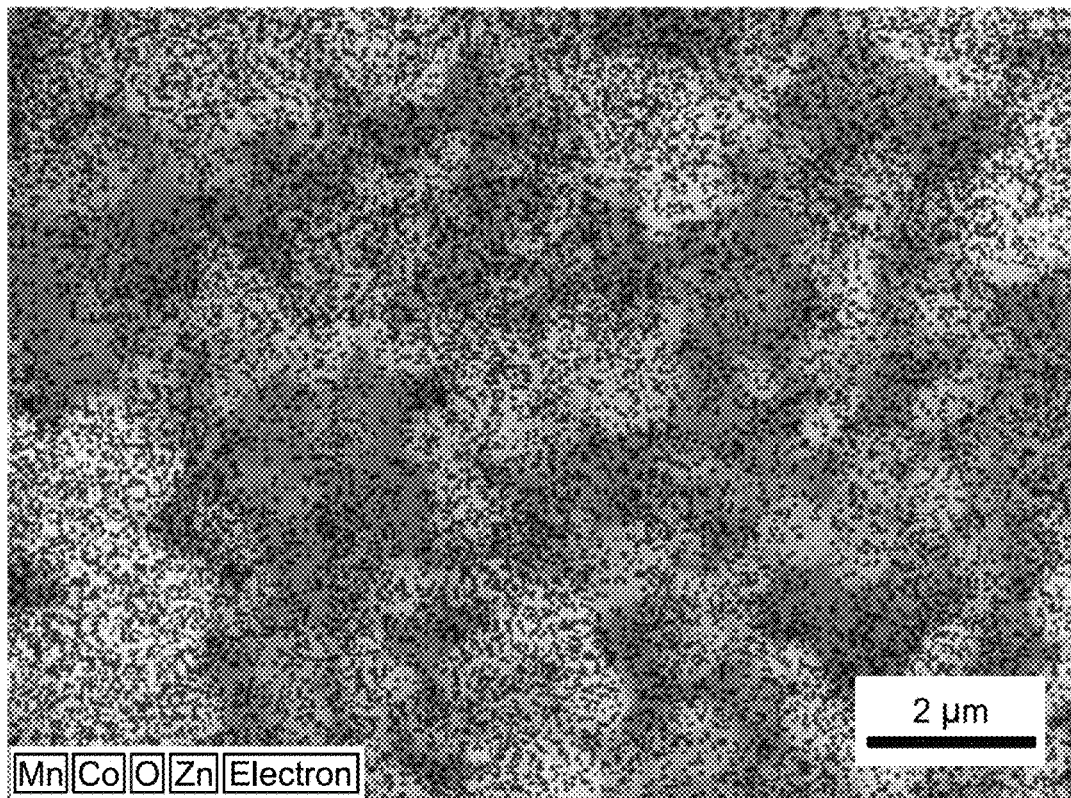
FIG. 5A
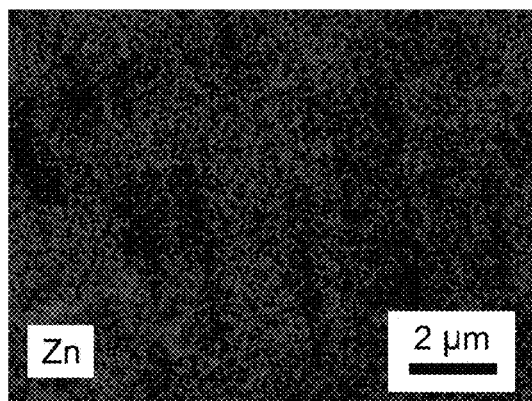 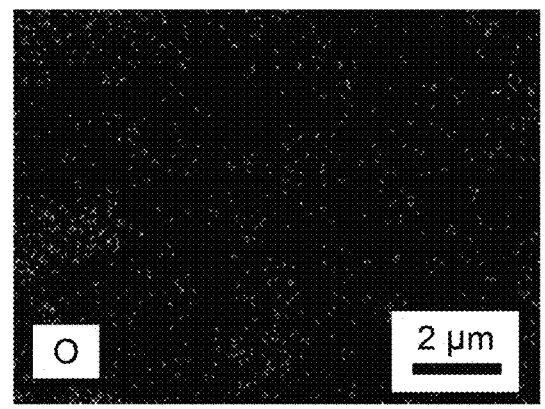
FIG. 5B                    FIG. 5C

MESOSCOPIC INVERTED PEROVSKITE SOLAR CELL

CROSS-REFERENCE TO RELATED APPLICATIONS

The present application is a Continuation of U.S. application Ser. No. 18/490,839, now allowed, having a filing date of Oct. 20, 2023, which is a Continuation of U.S. application Ser. No. 18/335,701, now U.S. Pat. No. 11,827,528, having a filing date of Jun. 15, 2023.

STATEMENT OF ACKNOWLEDGEMENT

The inventors acknowledge the support provided by the Interdisciplinary Research Center for Renewable Energy and Power Systems, King Fahd University of Petroleum and Minerals, Saudi Arabia, through Project INRE2210.

BACKGROUND

Technical Field

The present disclosure is directed to an electron transport material, particularly to an electron transport material including ZnO nanoparticles co-doped with manganese and zinc for solar cell applications.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly nor impliedly admitted as prior art against the present disclosure.

During the past decade, metal halide perovskites (MHPs) have raised emerging materials as absorbers for third-generation photovoltaic (PV) applications. Numerous methods have been adopted to fabricate perovskite solar cells (PSCs), i.e., spin coating, chemical vapor deposition (CVD), evaporation, slot die, solid-state methods, etc.

Charge transport layers (CTLs) improve PSC performance and stability. Energy levels govern the charge mining capability of the CTLs. Generally, n-type materials are used for electron transport layer (ETL) and p-type materials are used for the hole transport layer (HTL). The optical and electrical properties of the CTLs, which include ETLs and HTLs, influence the performance of the PSCs. Inorganic-based CTLs show better stability and cost-effectiveness than organic-based CTLs. Selecting ETLs and HTLs improve the performance and stability of the PSCs.

Metal oxides such as $NiO_x$, $CuO_x$, $MoO_x$, and $VO_x$, as well as metal oxides doped with transition metals, alkali metals, and rare earth metals are used in HTLs. $TiO_2$, $SnO_2$, ZnO, and metal-doped ZnO are used in ETLs. Zinc oxide is considered a cost-effective and low-temperature processed ETL for perovskite solar cells and offers decent mobility. However, an interface reaction occurs via a reaction of zinc oxide with the organic-inorganic metal hybrid halide perovskite absorber, which results in the degradation of the PSCs. To overcome the issue of PSC degradation, metal doping of the zinc oxide is carried out; However, metal doping causes a reduction in the transmittance of the zinc oxide ETL layer because of high absorption. Thus, the overall performance of the PSCs are reduced due to the lessening of the photogenerated current. To overcome this drawback, metal co-doping is employed to increase the bandgap and transmittance of the ZnO-based ETL via co-doping in ZnO to enhance the electrical properties. Co-doping with cobalt hampers the transmittance, thus, incorporating other metals is done to restore the transparency of the ZnO-based ETL. Accordingly, an object of the present disclosure is to provide an electron transport material that can overcome limitations of the art.

SUMMARY

In an exemplary embodiment of the present disclosure, an electron transport material is disclosed. The electron transport material includes a metal co-doped zinc oxide compound having a formula $Mn_xCo_{0.015}Zn_{1-x}O$, wherein x has a value in a range of 0.001 to 0.014.

In some embodiments, a process of making the metal co-doped zinc oxide compound is disclosed. The process includes dissolving a zinc salt to form an aqueous mixture; adding a manganese salt, a cobalt salt, and a sodium hydroxide solution to the aqueous mixture; reacting the aqueous mixture in an autoclave to form nanoparticles; washing the nanoparticles and isolating the nanoparticles and drying the nanoparticles; and then annealing the nanoparticles in a furnace to form the metal co-doped zinc oxide compound.

In some embodiments, the autoclave is at a temperature of 150 to 200° C. during reacting the aqueous mixture for a time of 2 to 6 hours.

In some embodiments, the furnace is at a temperature of 250 to 300° C. during annealing the nanoparticles for a time of 1 to 4 hours.

In an exemplary embodiment, an electron transport film including the electron transport material is described. A process of making the electron transport film includes dispersing the metal co-doped zinc oxide compound in an organic solvent to form a product-containing suspension; and depositing the product-containing suspension on a glass substrate with a spin coater to form the electron transport film.

In some embodiments, the metal co-doped zinc oxide compound is in the form of granular nanoparticles. In some embodiments, the granular nanoparticles have a hexagonal disc shape. In some embodiments, the granular nanoparticles have an average particle diameter of 0.1 to 2 μm.

In some embodiments, the metal co-doped zinc oxide compound has an inter-planar spacing of 2.460 to 2.480 Å. In some embodiments, the metal co-doped zinc oxide compound has an atomic packing fraction of 0.51650 to 0.51950. In some embodiments, the metal co-doped zinc oxide compound has a unit cell volume of 47.120 to 47.360 Å$^3$. In some embodiments, the metal co-doped zinc oxide compound has a lattice strain of $2.50 \times 10^{-3}$ to $3.15 \times 10^{-3}$. In some embodiments, the metal co-doped zinc oxide compound has a dislocation density of $5.4000 \times 10^{-6}$ to $7.6000 \times 10^{-6}$ 1/Å$^2$. In some embodiments, the metal co-doped zinc oxide compound has a bandgap (Eg) with a value of 3.00 to 3.80 eV. In some embodiments, x is 0.008, and the metal co-doped zinc oxide compound has a bandgap (Eg) with a value of 3.55 to 3.75 eV. In some embodiments, the metal co-doped zinc oxide compound has an absorption coefficient with a value of $1.00 \times 10^4$ to $8.50 \times 10^4$ cm$^{-1}$ at a wavelength value of 400 nm. In some embodiments, x is 0.008, and the metal co-doped zinc oxide compound has an absorption coefficient with a value of $4.50 \times 10^4$ to $5.00 \times 10^4$ cm$^{-1}$ at a wavelength value of 400 nm. In some embodiments, the metal co-doped zinc oxide compound has a refractive index with a value of 1.350 to 1.500 at a wavelength of 600 nm. In some embodiments, x is 0.008, the metal co-doped zinc oxide compound has a refractive index with a value of 1.420 to 1.435 at a wavelength of 600 nm.

In an exemplary embodiment, a perovskite solar cell including the electron transport material is described.

These and other aspects of non-limiting embodiments of the present disclosure will become apparent to those skilled in the art upon review of the following description of specific non-limiting embodiments of the disclosure in conjunction with the accompanying drawings.

BRIEF DESCRIPTION OF THE DRAWINGS

A better understanding of embodiments of the present disclosure (including alternatives and/or variations thereof) may be obtained with reference to the detailed description of the embodiments along with the following drawings, in which:

FIG. 5A shows an energy dispersive X-ray spectroscopy (EDS) layered image of the $Mn_xCo_{0.015}Zn_{1-x}O$ powder with 0.008 Mn content, according to certain embodiments;

FIG. 5B shows EDS elemental mapping of zinc (Zn) for the $Mn_xCo_{0.015}Zn_{1-x}O$ powder with 0.008 Mn content, according to certain embodiments;

FIG. 5C shows EDS elemental mapping of oxygen (O) for the $Mn_xCo_{0.015}Zn_{1-x}O$ powder with 0.008 Mn content, according to certain embodiments;

DETAILED DESCRIPTION

Figure 1:
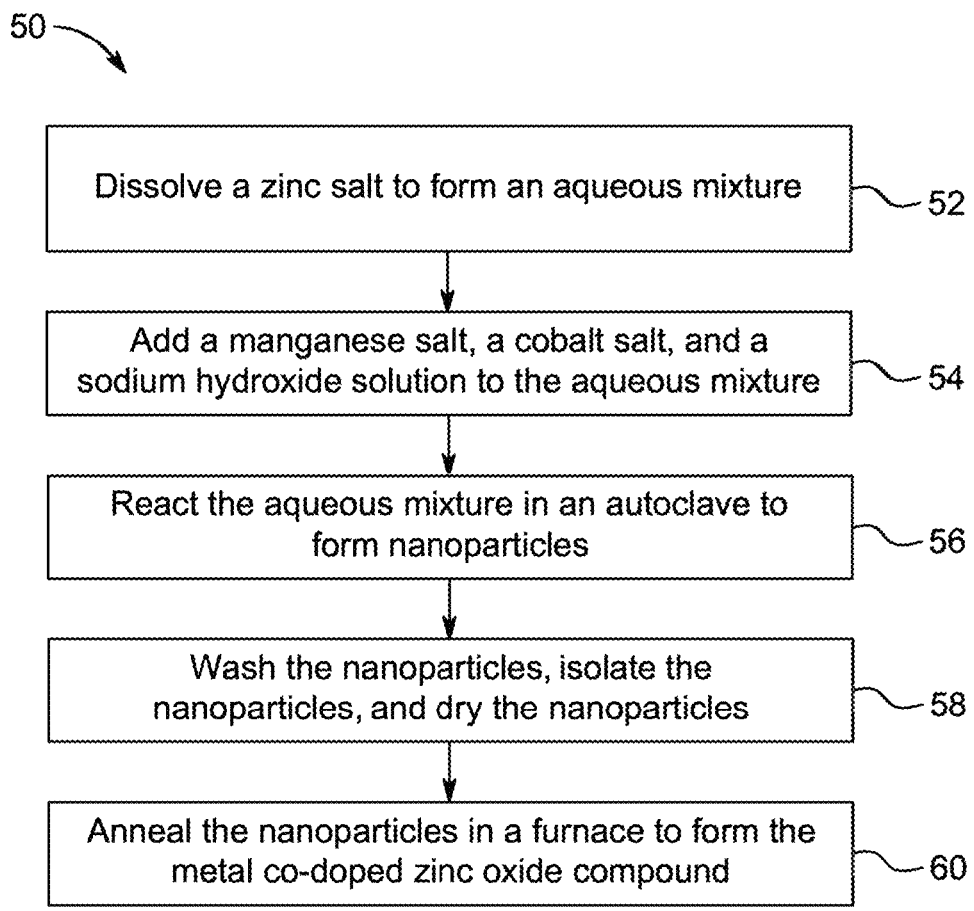
FIG. 1 is a flowchart depicting a method of making a metal co-doped zinc oxide compound ($Mn_xCo_{0.015}Zn_{1-x}O$), according to certain embodiments.
Figure 2A:
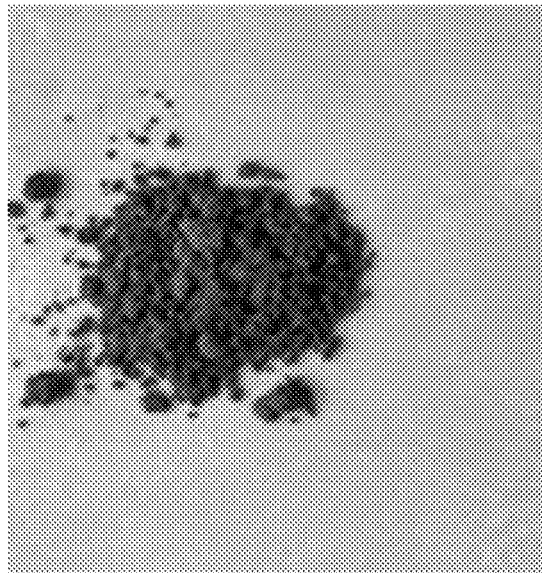
FIG. 2A depicts an optical image of the $Mn_xCo_{0.015}Zn_{1-x}O$ powder with 0 Mn content, according to certain embodiments.
Figure 2B:
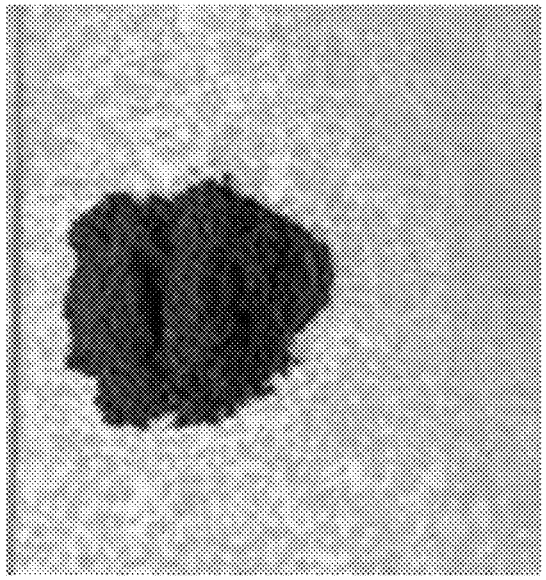
FIG. 2B depicts an optical image of the $Mn_xCo_{0.015}Zn_{1-x}O$ powder with 0.002 Mn content, according to certain embodiments.
Figure 2C:
FIG. 2C depicts an optical image of the $Mn_xCo_{0.015}Zn_{1-x}O$ powder with 0.008 Mn content, according to certain embodiments.
Figure 2D:
FIG. 2D depicts an optical image of the $Mn_xCo_{0.015}Zn_{1-x}O$ powder with 0.012 Mn content, according to certain embodiments.

In the following description, it is understood that other embodiments may be utilized, and structural and operational changes may be made without departure from the scope of the present embodiments disclosed herein.

Reference will now be made in detail to specific embodiments or features, examples of which are illustrates in the accompanying drawings. Wherever possible, corresponding or similar reference numbers will be used throughout the drawings to refer to the same or corresponding parts. Moreover, references to various elements described herein are made collectively or individually when there may be more than one element of the same type. However, such references are merely exemplary in nature. It may be noted that any reference to elements in the singular may also be constructed to relate to the plural and vice-versa without limiting the scope of the disclosure to the exact number or type of such elements unless set forth explicitly in the appended claims.

Further, as used herein, the words "a," "an," and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

Aspects of the present disclosure are directed to ZnO-based compounds (e.g., $Mn_xCo_{0.015}Zn_{1-x}O$ where x=0 (0%), 0.002 (0.2%), 0.008 (0.8%), and 0.012 (1.2%) and percent is based on an atomic percent on Mn) via the co-doping of Mn and Co into ZnO. For use as an electron transport material. The ZnO-based compounds may be applied as a layer in an electron transport layer in a perovskite solar cell, semiconductor systems, and the like. The influence of the Mn content on the properties, such as structural, morphological, optical, photoluminescence, and elemental properties, is described with respect to applicability in perovskite solar cells (PSCs). XRD results revealed that the inter-planar spacing, cell parameters, unit cell volume, lattice strain, and dislocation density were maximum for the Mn content of 0.2%.

Perovskite solar cells have been used as an alternative to single-cell photovoltaics and thin film photovoltaics due to the increased energy efficiency performance of the PSCs. Perovskite solar cells comprise an electrode, a hole transport layer (HTL), a perovskite, an electron transport layer (ETL), optionally a metal oxide film such as an indium tin oxide (ITO) film, and optionally a mesoporous layer, and the like. The electrode in the PSCs may be an organic electrode, such as a carbon electrode, an inorganic electrode, an organic-inorganic electrode, and the like. The hole transport layer in the PSCs facilitate hole extraction and transportation while blocking electron flux. The hole transport layer may be made of conventional hole transport layer material such as, but not limited to, poly[(9,9-dioctylfluorenyl-2,7-diyl)-co-(4,4'-(N-(4-sec-butylphenyl)diphenylamine))], poly(9-vinyl carbazole), poly[N,N'-bis(4-butylphenyl)-N,N'-bisphenylbenzidine], tris(4-carbazoyl-9-ylphenyl)amine, 4,4'-bis(9-carbazolyl)-1,1'-biphenyl, a mixture of any combination thereof, and the like. The perovskite layer may be of the formula $ABX_3$, where A and B are positively charged ions and X is a negatively charged ion. The electron transport layer in the PSCs facilitate the flow of electrons between layers of the PSC. The electron transport layers may be made of metal oxides, layered metal oxides, doped metal oxides, the $Mn_xCo_{0.015}Zn_{1-x}O$ material of the current disclosure, a combination thereof, and the like. The metal oxide layer may be supported on a glass substrate support. The mesoporous layer may be optionally included in the PSCs and may include a conductive, porous material capable of facilitating or filtering the flow of electrons in the PSCs.

The perovskite solar cell may come in different types and forms depending on the order of the one or more the layers. PSC may be conventional or inverted and planar or mesoscopic. In a mesoscopic conventional PSC, the device from top to bottom includes an electrode layer, a hole transport layer, a perovskite layer, a mesoporous layer, an electron transport layer, and a metal oxide layer. In a planar conventional PSC, the device from top to bottom includes an electrode layer, a hole transport layer, a perovskite layer, an electron transport layer, and a metal oxide layer.

In a mesoscopic inverted PSC, the device from the top to bottom includes an electrode layer, an electron transport layer, a perovskite layer, a mesoporous layer, a hole transport layer, and a metal oxide layer. In a planar inverted PSC, the device from top to bottom includes an electrode layer, an electron transport layer, a perovskite layer, a hole transport layer, and a metal oxide layer [See: Wang et. al., *J. Phys. Energy*, 3, 2021, 012004, incorporated herein by reference in its entirety].

The ZnO-based materials were characterized and evaluated for their potential use in an electron transport layer by X-ray diffraction (XRD), Fourier-transform infrared (FTIR) spectroscopy, field-emission scanning electron microscopy (FESEM), energy-dispersive X-ray (EDS) spectroscopy, UV-vis spectroscopy, ellipsometry, X-ray fluorescence (XRF), photoluminescence, transmission electron microscopy (TEM), and thermal gravimetric analysis (TGA). The acquired values of $E_g$ are 3.39, 3.52, 3.61, and 3.18 eV for x=0, 0.2%, 0.8%, and 1.2%, respectively. The corresponding absorption coefficient is reduced with increasing Mn content. The obtained refractive indices are 1.437, 1.402, 1.428, and 1.426 for x=0, 0.2, 0.8, and 1.2%, respectively. The above results confirm that the $Mn_xCo_{0.015}Zn_{1-x}O$ with x=0.8% provides the lowest absorption and the highest bandgap value. Thus, it is a suitable ETL for high-performance PSCs.

Embodiments of the present disclosure provide an electron transport material. The electron transport material includes a metal co-doped zinc oxide compound (also called compound) having a formula $Mn_xCo_{0.015}Zn_{1-x}O$, wherein x has a value in a range of 0.001 to 0.014. The metal co-doped zinc oxide compound may be amorphous, polycrystalline, or crystalline, preferably crystalline. Zinc oxide may crystallize in a hexagonal wurtzite form and a cubic zincblende form. In a zinc oxide structure, a zinc ion is located in the center of a tetrahedron comprising oxygen atoms. Each zinc ion ($Zn^{2+}$) is surrounded by four oxygen atoms, which form a cation with a coordination number of four. For the metal co-doped zinc oxide compound, the degree of crystallinity depends on the percentage of manganese in the compound. The cobalt ($Co^{2+}$) and manganese ($Mn^{2+}$) ions are doped into the zinc oxide structure and substituted at the $Zn^{2+}$ sites to form the compound. The ionic radii of $Co^{2+}$(0.67 Å) and $Mn^{2+}$(0.68 Å) are similar and slightly larger to that of $Zn^{2+}$(0.6 Å), facilitating substitution and distorting crystallinity. In some embodiments, the metal co-doped zinc oxide compound is in the form of a powder. In an embodiment, the powder comprises granular nanoparticles. In an embodiment, the granular nanoparticles have a hexagonal disc shape. In some embodiments, the granular nanoparticles have an average particle diameter of 0.1 to 2 μm.

FIG. 1 illustrates a flow chart of a method 50 of making a metal co-doped zinc oxide compound. The order in which the method 50 is described is not intended to be construed as a limitation, and any number of the described method steps can be combined in any order to implement the method 50. Additionally, individual steps may be removed or skipped from the method 50 without departing from the spirit and scope of the present disclosure.

At step 52, the method 50 includes dissolving a zinc salt to form an aqueous mixture. Suitable examples of zinc salts include zinc chloride, zinc gluconate, zinc sulfide, zinc pyrophosphate, zinc sulfate, zinc nitrate, zinc carbonate, zinc acetate, zinc citrate, zinc lactate, and combinations and hydrates thereof. In a preferred embodiment, the zinc salt is zinc acetate. The zinc acetate may be anhydrous or hydrated. In an embodiment, a dihydrate form of zinc acetate is used to form the aqueous mixture. In an embodiment, 0.01 to 0.10 moles, preferably 0.01 to 0.05 moles, more preferably 0.02 to 0.04 moles, and yet more preferably about 0.035 moles of the dihydrate form of zinc acetate is dissolved in deionized water to form the aqueous mixture. In an embodiment, the deionized water is in an amount of 50 to 200 mL, preferably 50 to 100 mL, more preferably, 60 to 80 mL, and yet more preferably about 70 mL. The concentration of the zinc salt in the aqueous mixture is in the range of 0.1 to 1.0 M, preferably about 0.5 M.

At step 54, method 50 includes adding a manganese salt, a cobalt salt, and a sodium hydroxide solution to the aqueous mixture. Suitable examples of manganese salts include manganese chloride, manganese sulfate, manganese acetate, manganese nitrate, manganese carbonate, and combinations and hydrates thereof. In an embodiment, the manganese salt is manganese acetate, preferably manganese (II) acetate tetrahydrate. Suitable examples of cobalt salts include cobalt sulfate, cobalt chloride, cobalt acetate, cobalt nitrate, cobalt sulfamate, and or combinations and hydrates thereof. In an embodiment, the cobalt salt is cobalt nitrate, preferably cobalt nitrate hexahydrate. The ratio of the zinc salt to the manganese salt plays a role in the performance of the electron transport material. In an embodiment, the molar ratio of the manganese salt to the zinc salt is in a range of 1:50 to 1:2000, preferably 1:50 to 1:1000, and more preferably 1:50 to 1:500. In an embodiment, the sodium hydroxide solution may be in a concentration of 0.5 M to 5 M, preferably, 0.5 M to 2 M, and more preferably about 1 M. In a preferred embodiment, about 4 grams of the sodium hydroxide was dissolved in about 100 mL of deionized water and added to the aqueous mixture. The aqueous mixture was slowly stirred to promote uniform distribution of the salts. This step is preferably performed at room temperature for 30 minutes to 2 hours, preferably about 1 hour. Optionally, other bases, such as, lithium hydroxide, potassium hydroxide, ammonia, amine, quaternary ammonium hydroxide, and the like, may be used respectively alone or in a mixture instead of and in combination with NaOH.

At step 56, the method 50 includes reacting the aqueous mixture in an autoclave to form nanoparticles. The nanoparticles are prepared by subjecting the aqueous mixture to a hydrothermal reaction. The hydrothermal reaction is preferably carried out at a temperature range of 100 to 200° C., preferably 150 to 200° C., and yet more preferably 180° C., and the pressure is from 1 to 30 pound-force per square inch (psi), preferably about 15 psi. The reaction time is generally from 1 to 30 hours, preferably from 2 to 10 hours, preferably 2 to 6 hours, preferably 3 to 5 hours, yet more preferably about 4 hours. The hydrothermal reaction preferably occurs in an autoclave having a Teflon resin or glass inner wall or an autoclave applied with glass lining treatment. This autoclave may be used in a sealed system but may also be used in a flowing system in order to raise production efficiency. The pH of the aqueous mixture is preferably maintained between 8 and 11 during the hydrothermal reaction.

At step 58, the method 50 includes washing the nanoparticles, isolating the nanoparticles, and drying the nanoparticles. The nanoparticles obtained from the reaction in the autoclave are washed one or more times, preferably 1 to 50 times, more preferably 1 to 20 times, and yet more preferably 3 to 10 times with an aqueous solvent, preferably water, and more preferably deionized water, to remove impurities deposited on the nanoparticles. The nanoparticles may be isolated by filtration or centrifugation. In a preferred embodiment, the nanoparticles are subjected to centrifugation at 7000 rpm to 15000 rpm, preferably 9000 to 12000 rpm, and more preferably 10000 rpm, for 1 to 10 minutes, preferably 2 to 8 minutes, more preferably 3 to 5 minutes, and yet more preferably 3 to 4 minutes. The nanoparticles are further dried to remove moisture at a temperature range of 50 to 120° C., preferably 60 to 100° C., and more preferably about 80° C. The nanoparticles are preferably vacuum dried (in a vacuum oven) to prevent any air oxidation. The pressure of the vacuum is from 1 to 30 psi, preferably 10 to 20 psi, and more preferably about 15 psi. Optionally, ovens, microwaves, autoclaves, hot plates, heating mantles and tapes, oil baths, salt baths, sand baths, air baths, hot-tube furnaces, hot-air guns, and the like may be used for drying the nanoparticles. Drying the nanoparticles occurs for 6 to 24 hours, preferably 8 to 16 hours, and more preferably about 12 hours.

At step 60, the method 50 includes annealing the nanoparticles in a furnace to form the metal co-doped zinc oxide compound. The annealing process may be carried out for one or more cycles, preferably for one cycle in a furnace. Suitable examples of the furnace include muffle furnace, electric furnace, tube furnace, box furnace, crucible furnace, microwave furnace, vacuum furnace, rotary kiln, or fluidized bed furnace. The annealing was carried out by heating the nanoparticles to a temperature range of 150 to 400° C., preferably 200 to 300° C., more preferably 250 to 300° C., and yet more preferably about 270° C., at a heating ramp rate of 1 to 20° C./min, preferably 3 to 15° C./min, preferably 5 to 10° C./min, more preferably at about 5° C./min in an inert atmosphere comprising nitrogen, argon, and synthetic air, alone or in combination. This process was carried out in a furnace for about 1 to 5 hours, preferably 1 to 4 hours, and more preferably about 2 hours, to obtain the metal co-doped zinc oxide compound.

The metal co-doped zinc oxide compound in the electron transport material has an inter-planar spacing ($d_{101}$) of 2.460 to 2.480 Å, preferably 2.465 to 2.475 Å, and more preferably about 2.469 to 2.473 Å; an atomic packing fraction (APF) of 0.51650 to 0.51950, preferably 0.51700 to 0.51900, and more preferably about 0.51702 to 0.51903; an absorption coefficient with a value of $1.00 \times 10^4$ to $8.50 \times 10^4$ cm$^{-1}$ at a wavelength value of 400 nm; a unit cell volume of 47.120 to 47.360 Å$^3$, preferably 47.130 to 47.355 Å$^3$, and more preferably about 47.132 to 47.352 Å3; a lattice strain ($\varepsilon_{101}$) of $2.50 \times 10^{-3}$ to $3.15 \times 10^{-3}$, preferably $2.65 \times 10^{-3}$ to $3.10 \times 10^{-3}$, and more preferably about $2.60 \times 10^{-3}$ to $3.06 \times 10^{-3}$; a dislocation density of $5.4000 \times 10^{-6}$ to $7.6000 \times 10^{-6}$ 1/Å2, preferably $5.4500 \times 10^{-6}$ to $7.5700 \times 10^{-6}$ 1/Å$^2$, and more preferably about $5.4604 \times 10^{-6}$ to $7.5620 \times 10^{-6}$ 1/Å$^2$; a refractive index with a value of 1.350 to 1.500, preferably 1.400 to 1.440 at a wavelength of 600 nm; and a bandgap ($E_g$) with a value of 3.00 to 3.80 eV, preferably 3.15 to 3.65 eV. In some embodiments, when x is about 0.008, and the metal co-doped zinc oxide compound has a bandgap (Eg) with a value of 3.55 to 3.75 eV; and an absorption coefficient with a value of $4.50 \times 10^4$ to $5.00 \times 10^4$ cm$^{-1}$ at a wavelength value of 400 nm; and a refractive index with a value of 1.420 to 1.435 at a wavelength of 600 nm.

The metal co-doped zinc oxide compound thus prepared may be further used to make the electron transport film. For this purpose, the metal co-doped zinc oxide compound may be dispersed in an organic solvent to form a product-containing suspension. Suitable examples of organic solvent include, 1,2-dichlorobenzene, chlorobenzene, methylbenzene, chloroform, ethanol, and or combinations thereof. In some embodiments, a dry impregnation technique may be employed, instead of wet impregnation (using a solvent). Examples of a dry deposition process include physical vapor deposition, evaporation and sublimation, chemical vapor deposition, organic molecular beam deposition, molecular layer deposition, and the like. The product-containing suspension may be further dispersed on a glass substrate with a spin coater to form the electron transport film. The glass substrate may be cleaned before the dispersion of the product-containing suspension to remove any impurities that may affect the film formation. In an embodiment, the glass substrate may be cleaned by ultrasonication with a detergent and/or water. The ultrasonication may be carried out using a probe or an ultrasonic bath. The glass substrates may also be subjected to ultraviolet (UV) irradiation for 10 to 20 minutes, preferably 15 minutes before use as a substrate. During the spin coating process, the speed of the spin coater was then raised to 1000 rpm. The speed was held for 20 to 60 seconds, preferably 20 to 40 seconds, and more preferably about 30 seconds, and then immediately decreased to zero. Films were placed in a vacuum oven overnight and held at 120° C. to remove residual solvent. Optionally, other techniques such as spray coating, slot-die printing, die printing, ink-jet printing, and the like may be employed to prepare the electron transport film instead of or in combination with spin-coating.

The electron transport material of the present disclosure may form at least a portion of any electronic device suitable for a perovskite material, such as, but not limited to, a solar cell, a light emitting diode (LED), a transistor, a sensor, or a combination thereof.

EXAMPLES

The following examples demonstrate an electron transport material as described herein. The examples are provided solely for illustration and are not to be construed as limitations of the present disclosure, as many variations thereof are possible without departing from the spirit and scope of the present disclosure.

Synthesis of $Mn_xCo_{0.015}Zn_{1-x}O$ Nanoparticles

First, 0.035 moles of zinc acetate dihydrate, $Zn(CH_3COO)_2 \cdot 2H_2O$, was dissolved in 70 mL of deionized (DI) water to form a mixture. Manganese(II) acetate tetrahydrate, $Mn(CH_3COO)_2 \cdot 4H_2O$, and cobalt nitrate hexahydrate, $Co(NO_3)_2 \cdot 6H_2O$, were added to the mixture at various $Mn_xCo_{0.015}Zn_{1-x}O$ molar ratios (x=0.0, 0.002, 0.008, and 0.012). Next, a NaOH solution (0.1 moles in 100 mL DI water) was slowly added until the solution had a uniform distribution while stirring at room temperature. The reaction mixture was then stirred for 1 hour at the same temperature. Finally, the solution was transferred to a Teflon-lined autoclave and heated in an oven at 180° C. for 4 hours to form the $Mn_xCo_{0.015}Zn_{1-x}O$ (MCZO) nanoparticles (NPs).

The synthesized $Mn_xCo_{0.015}Zn_{1-x}O$ NPs for (x=0.0, 0.002, 0.008, and 0.012) were referred as 0%, 0.2%, 0.8%, and 1.2%, respectively. $Mn_xCo_{0.015}Zn_{1-x}O$ NPs were washed with DI water several times and centrifuged at 10,000 rpm for 3.30 minutes. Finally, the solution dried at 70° C. in a vacuum oven overnight, annealed in a furnace (air atmosphere) at 270° C. for 2 hours, and dispersed in ethanol at a concentration of 10 mg/mL. Glass substrates were cleaned as follows.

First, they were cleaned by ultrasonication in detergent and DI water and then DI water. Finally, they were treated with UV ozone for 15 minutes. The $Mn_xCo_{0.015}Zn_{1-x}O$ NPs in ethanol was deposited on the glass substrates using a spin coater at 1000 rpm for 30 seconds to form a film.

Characterization

The X-ray diffraction (XRD; Rigaku Miniflex-II system; manufactured by Rigaku, 3 Chome-9-12 Matsubaracho, Akishima, Tokyo 196-8666, Japan) patterns of the $Mn_xCo_{0.015}Zn_{1-x}O$ (MCZO) NPs were recorded over the 2θ range of 20° to 70° using a Cu/Kα radiation (λ=1.5406 Å). Fourier-transform infrared (FTIR; Smart iTR NICOLET iS10; manufactured by Thermo Fisher Scientific, 168 3rd Ave, Waltham, MA 02451, United States) transmission spectra were collected at room temperature over the wavenumber range of 500-4000 cm$^{-1}$. The field-emission scanning electron microscopy (FESEM) images and energy dispersive X-ray (EDS) of the $Mn_xCo_{0.015}Zn_{1-x}O$ (MCZO) NPs were recorded (JEOL SEM, Model: JSM6610LV; manufactured by JEOL, 3-1-2 Musashino, Akishima, Tokyo 196-8558, Japan). The absorption spectra of all the samples were acquired using a JASCO UV-Vis-NIR spectrometer (Model: UV-670; manufactured by JASCO, 10 E Memorial Rd, Oklahoma City, OK 73114, United States). Ellipsometry was measured using an M-2000 ellipsometer (J. A. Woollam company, 311 S 7th St, Lincoln, NE 68508, United States). The X-ray Fluorescence (XRF) was carried out using Model: Xepos (manufactured by Xepos, 1301 Stratford Rd, Birmingham, West Midlands, B28 9HH, United Kingdom). Photoluminescence was carried out (Model: Fluorolog iHR 320). The high-resolution images were obtained using transmission electron microscopy (TEM, Model: JEM2100F; manufactured by JEOL SEM, Model: JSM6610LV; manufactured by JEOL, 3-1-2 Musashino, Akishima, Tokyo 196-8558, Japan). The spin coater used was EZ4 (manufactured by Leica, Ernst-Leitz-Strasse 17-37. 35578 Wetzlar Germany). The thermal gravimetric analyzer (TGA) was determined using SDT Q600 (manufactured by TA Instruments Inc., 159 Lukens Dr, New Castle, DE 19720, USA).

Structural and Bonding Properties

Figure 3A:
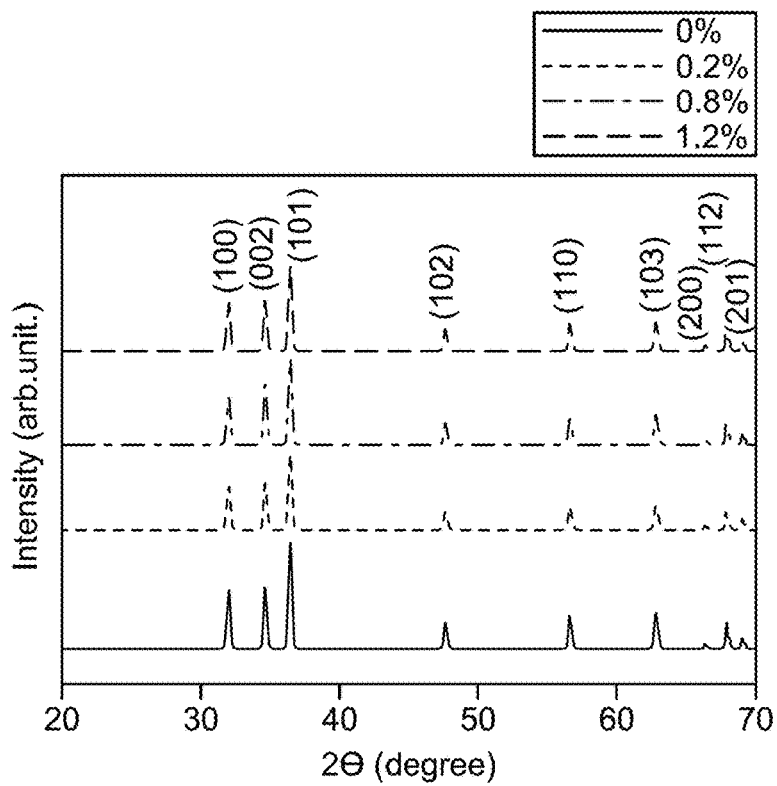
FIG. 3A is an X-ray diffraction (XRD) pattern of the $Mn_xCo_{0.015}Zn_{1-x}O$ powder, with varying Mn content, in a wide 2θ range, according to certain embodiments.
Figure 3B:
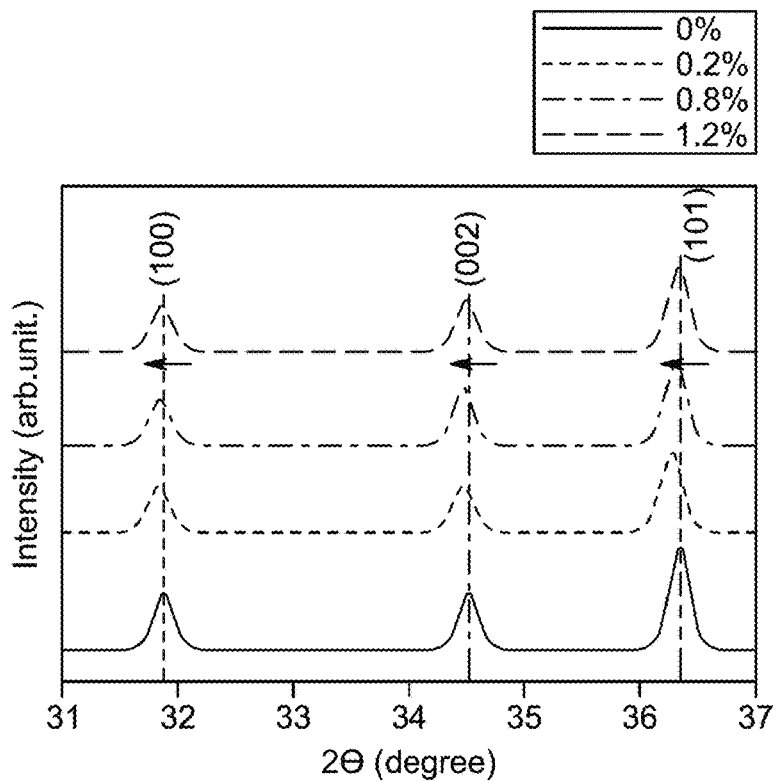
FIG. 3B is an enlarged portion of the XRD plot of FIG. 3A, according to certain embodiments.
Figure 3C:
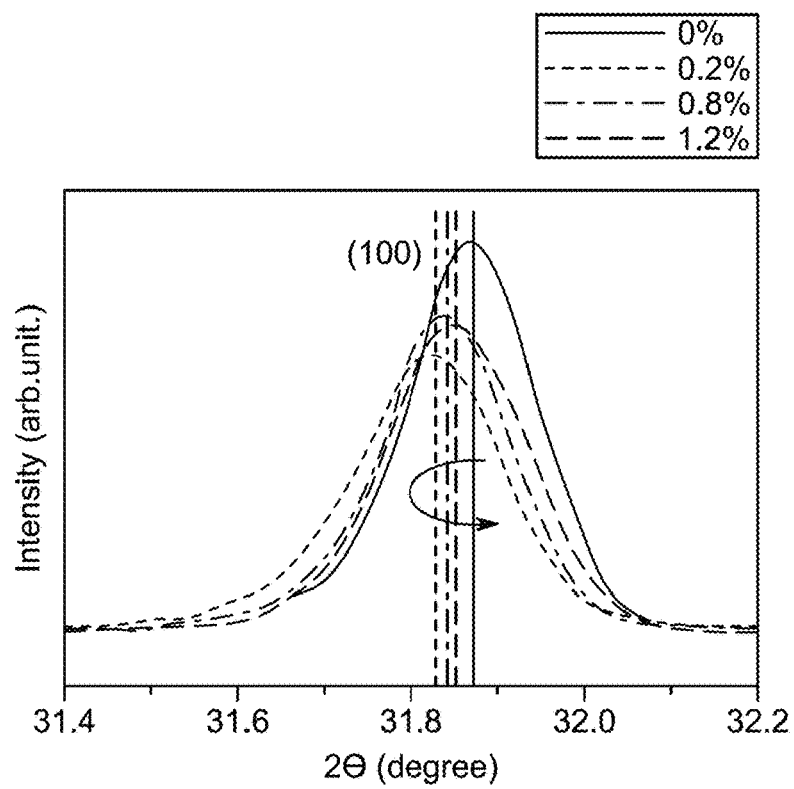
FIG. 3C depicts peak shifting of X-ray peaks corresponding to (100) Brag's plane, for the $Mn_xCo_{0.015}Zn_{1-x}O$ powder, according to certain embodiments.

The optical images of the $Mn_xCo_{0.015}Zn_{1-x}O$ powder are shown in FIGS. 2A-2D. The power color changes from brown to greenish brown after incorporating Mn. The crystalline quality of the $Mn_xCo_{0.015}Zn_{1-x}O$ (MCZO) hexagonal structure was investigated by XRD analysis, as observed in FIGS. 3A-3C. The diffraction peaks for the sample x=0.0 appear at 2θ=31.88°, 34.53°, 36.36°, 47.63°, 56.67°, 62.92°, 66.44°, 68°, and 69.13° for the diffraction plane of (100), (002), (101), (102), (110), (103), (200), (112), and (201), respectively. The obtained crystalline phase matches the wurtzite hexagonal phase of zinc oxide (JCPDS: 36-1451) [Joint Committee on Powder Diffraction Standards. Analytical Chemistry, 1970. 42(11): p. 81 Å-81 Å, incorporated herein by reference in its entirety]. With the incorporation of Mn (x=0.002), the XRD peaks shifted towards the lower 2θ value due to increasing the lattice spacing. However, with a further increase in the Mn content (x=0.008 and 0.012), the diffraction peaks were slightly shifted toward higher 2θ. Moreover, The XRD peak intensity of the MCZO first decreased for x=0.002, then increased for the higher content of Mn, indicating the crystallinity is improving for the Mn content of 0.8 and 1.2%. The crystallite size (D) of MCZO was determined using the Debye-Scherrer's relation (Eq. (1)):

$$D_{hkl} = \frac{0.9\lambda_{XRD}}{\beta_{hkl}\cos\theta} \tag{1}$$

where, $\lambda_{XRD}$ is the wavelength of used X-rays (1.5408 Å), β is the angular full width at half maximum (in radian), and θ is the Bragg's diffraction angle.

The plane spacing (d) was calculated by Eq. (2):

$$d_{hkl} = \frac{\lambda_{XRD}}{2\sin\theta} \tag{2}$$

The value of lattice constants "a" and "c" were calculated corresponding to Bragg's planes of (100) and (002), respectively using Eq. (3) and Eq. (4):

$$a = \frac{\lambda}{\sqrt{3}\cdot\sin\theta} \tag{3}$$

$$c = \frac{\lambda}{\sin\theta} \tag{4}$$

The volume (V) of the unit cell for the hexagonal system was determined using Eq. (5):

$$V = \frac{\sqrt{3}}{2}a^2 c \tag{5}$$

The lattice parameters (a & c) were used to determine the atomic packing factor (APF) using Eq. (6):

$$\text{Atomic packing factor} = \frac{c}{a} \tag{6}$$

The dislocation density (δ in 1/nm²) was calculated using Eq. (7):

$$\delta = \frac{1}{D^2} \tag{7}$$

The lattice strain ($\varepsilon_{hkl}$) was determined using Eq. (8):

$$\varepsilon_{hkl} = \frac{\beta_{hkl}}{4\tan\theta} \tag{8}$$

The Zn—O bond length (L in Å) was calculated using Eq. (9):

$$L = \sqrt{\left(\frac{a^2}{3}\right) + \left(\frac{1}{2}-\mu\right)^2 \ast c^2} \tag{9}$$

where μ is the amount of the displacement of the atom relative to the next one along the c-direction (known as the positional parameter), which is calculated using Eq. (10):

$$\mu = \frac{a^2}{3c^2} + \frac{1}{4} \tag{10}$$

The atomic packing fraction (APF) was determined using Eq. (11):

$$APF = \frac{2\pi a}{3\sqrt{3}c} \tag{11}$$

The above parameters were tabulated in Table 1. It can be seen that the insertion of Mn causes a reduction of 2θ value, which further increases with increasing Mn content. The inter-planar spacing ($d_{101}$) corresponding to the (101) plane is 2.469, 2.473, 2.471, and 2.471 Å for Mn content of 0, 0.2, 0.8, and 1.2%, respectively. The highest values of inter-planar spacing (2.473 Å), lattice strain (3.06 x10⁻³), and dislocation density (7.5620) are observed for MCZO-0.2%. Due to the highest positional parameters of MCZO-0.2%, the values of cell parameters, bond length, and APF are also at a maximum for x=0.2%. With a further increase of the Mn content, the distortion parameter is slightly reduced, which results in the reduction of cell parameter and the unit cell volume. The average crystallite sizes were 38.12, 33.65, 36.43, and 35.45 nm for x=0.0%, 0.2%, 0.8%, and 1.2%, respectively.

TABLE 1

Structural parameters extracted from X-rays diffraction data of $Mn_xCo_{0.015}Zn_{1-x}O$.

| Sample | Diffracting angle, 2θ (°) | | | | |
|---|---|---|---|---|---|
| | (100) | (002) | (101) | (102) | (110) |
| MCZO-0% | 31.88 | 34.53 | 36.36 | 47.63 | 56.67 |
| MCZO-0.2% | 31.83 | 34.47 | 36.30 | 47.53 | 56.60 |
| MCZO-0.8% | 31.85 | 34.49 | 36.32 | 47.60 | 56.62 |
| MCZO-1.2% | 31.86 | 34.51 | 36.33 | 47.60 | 56.64 |

| Sample | Peak position, 2θ (°) for (101) plane | Inter-planar spacing, $d_{101}$ (Å) | Lattice strain, $\varepsilon_{101}$ x10⁻³ | Dislocation density, $\delta_{101}$ × 10⁻⁶ (1/Å2) |
|---|---|---|---|---|
| MCZO-0% | 36.36 | 2.469 | 2.60 | 5.4604 |
| MCZO-0.2% | 36.30 | 2.473 | 3.06 | 7.5620 |

TABLE 1-continued

Structural parameters extracted from X-rays diffraction data of $Mn_xCo_{0.015}Zn_{1-x}O$.

| Sample | | | | |
|---|---|---|---|---|
| MCZO-0.8% | 36.32 | 2.471 | 2.73 | 6.0096 |
| MCZO-1.2% | 36.33 | 2.471 | 2.87 | 6.6486 |

| | Cell parameters (Å) | | Cell volume, |
|---|---|---|---|
| Sample | a = b | c | V (Å³) |
| MCZO-0% | 3.238 | 5.191 | 47.132 |
| MCZO-0.2% | 3.243 | 5.199 | 47.352 |
| MCZO-0.8% | 3.241 | 5.196 | 47.267 |
| MCZO-1.2% | 3.240 | 5.194 | 47.218 |

| Sample | Positional parameter (u) | Atomic packing factor (c/a) | Bond length (Zn-O) L (Å) | The atomic packing fraction (APF) |
|---|---|---|---|---|
| MCZO-0% | 0.37977 | 1.60267 | 1.9714 | 0.51702 |
| MCZO-0.2% | 0.37976 | 1.60273 | 1.9744 | 0.51903 |
| MCZO-0.8% | 0.37975 | 1.60282 | 1.9732 | 0.51825 |
| MCZO-1.2% | 0.37976 | 1.60274 | 1.9725 | 0.51782 |

Figure 3D:
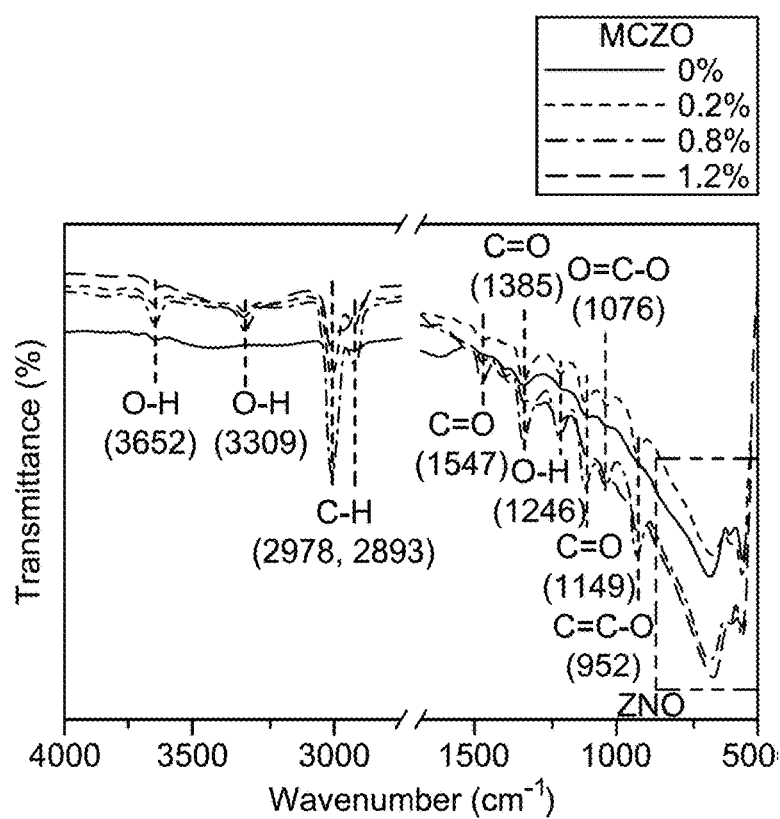
FIG. 3D illustrates Fourier transform infrared (FTIR) spectroscopy pattern of $Mn_xCo_{0.015}Zn_{1-x}O$ powder, according to certain embodiments.
Figure 4A:
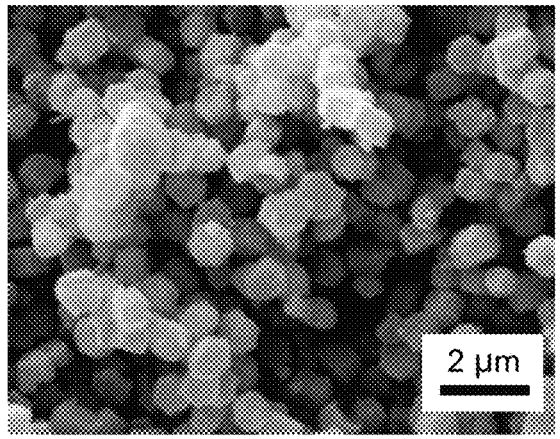
FIG. 4A shows a field-emission scanning electron microscopy (FESEM) image of the $Mn_xCo_{0.015}Zn_{1-x}O$ powder with 0 Mn content, according to certain embodiments.
Figure 4B:
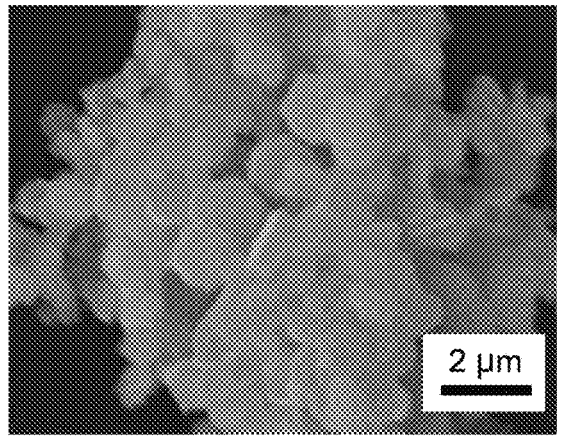
FIG. 4B shows a FESEM image of the $Mn_xCo_{0.015}Zn_{1-x}O$ powder with 0.002 Mn content, according to certain embodiments.
Figure 4C:
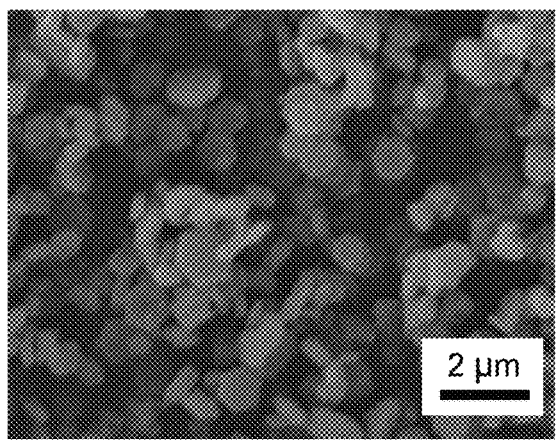
FIG. 4C shows a FESEM image of the $Mn_xCo_{0.015}Zn_{1-x}O$ powder with 0.008 Mn content, according to certain embodiments.
Figure 4D:
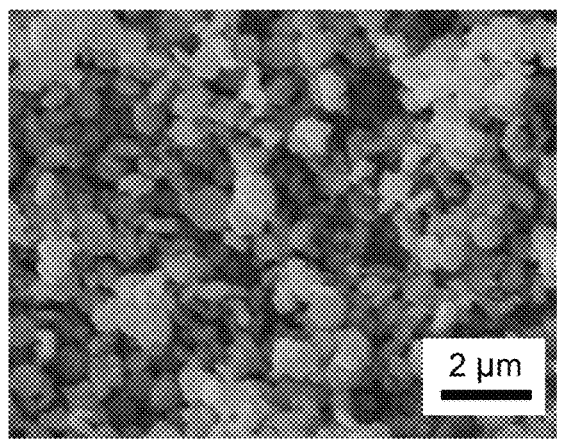
FIG. 4D shows a FESEM image of the $Mn_xCo_{0.015}Zn_{1-x}O$ powder with 0.012 Mn content, according to certain embodiments.

The FTIR spectra of MCZO are displayed in FIG. 3D. There are numerous FTIR absorption peaks relating to the Zn—O stretching mode in the 500 to 600 cm$^{-1}$ range. It can be seen that the absorption peak becomes more intense with the incorporation of Mn. However, the peak intensity is slightly reduced for x=0.012. A peak appeared in each sample at 620 cm$^{-1}$, suggesting the overlapping of Mn—O and Co—O stretching modes. This result supports the insertion of Co$^{2+}$ and Mn$^{2+}$ ions into the Zn$^{2+}$ sites of the ZnO lattice. The absorption band at ~1547 (symmetric) and ~1385 cm$^{-1}$ (asymmetric) support the stretching vibration of C=O.

Morphological and Thermal Analysis

Figure 5D:
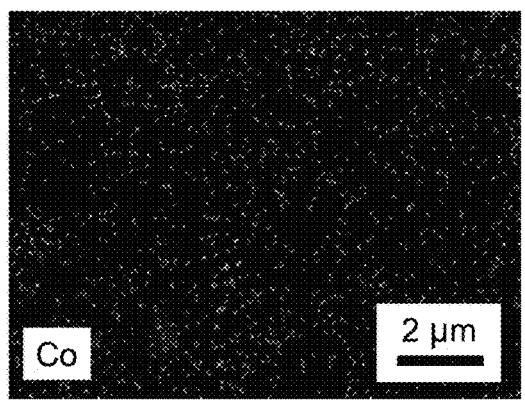
FIG. 5D shows EDS elemental mapping of cobalt (Co) for the $Mn_xCo_{0.015}Zn_{1-x}O$ powder with 0.008 Mn content, according to certain embodiments.
Figure 5E:
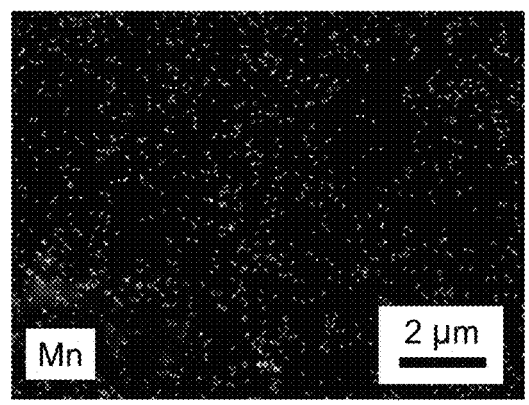
FIG. 5E shows EDS elemental mapping of manganese (Mn) for the $Mn_xCo_{0.015}Zn_{1-x}O$ powder with 0.008 Mn content, according to certain embodiments.
Figure 6A:
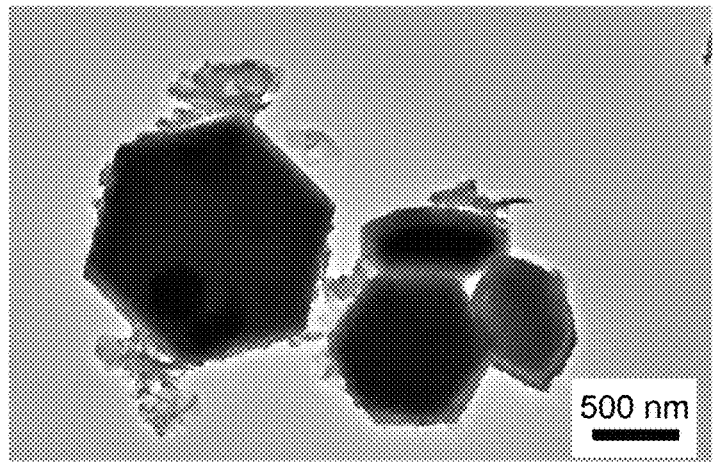
FIG. 6A shows a transmission electron microscopy (TEM) image of the $Mn_xCo_{0.015}Zn_{1-x}O$ powder with 0.002 Mn content, according to certain embodiments.
Figure 6B:
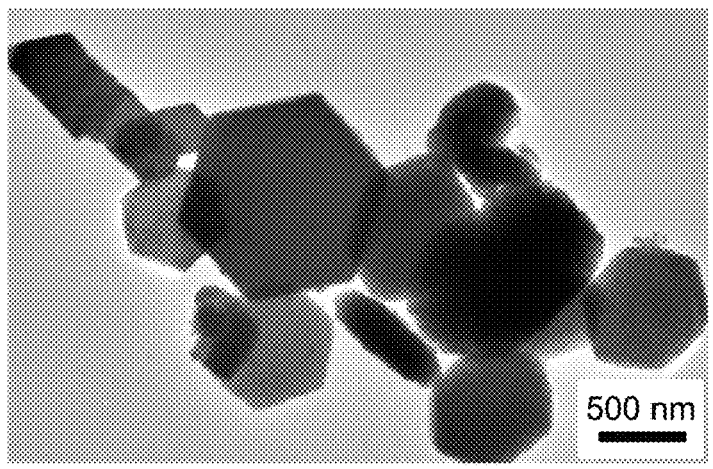
FIG. 6B shows a TEM image of the $Mn_xCo_{0.015}Zn_{1-x}O$ powder with 0.008 Mn content, according to certain embodiments.
Figure 6C:
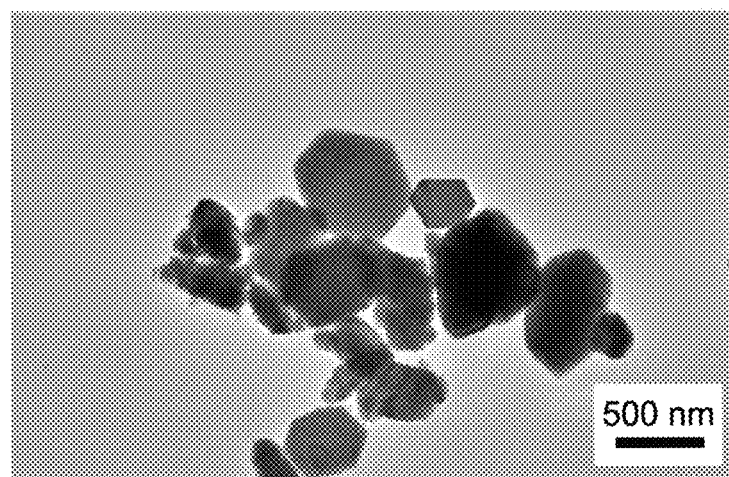
FIG. 6C shows a TEM image of the $Mn_xCo_{0.015}Zn_{1-x}O$ powder with 0.012 Mn content, according to certain embodiments.
Figure 7:
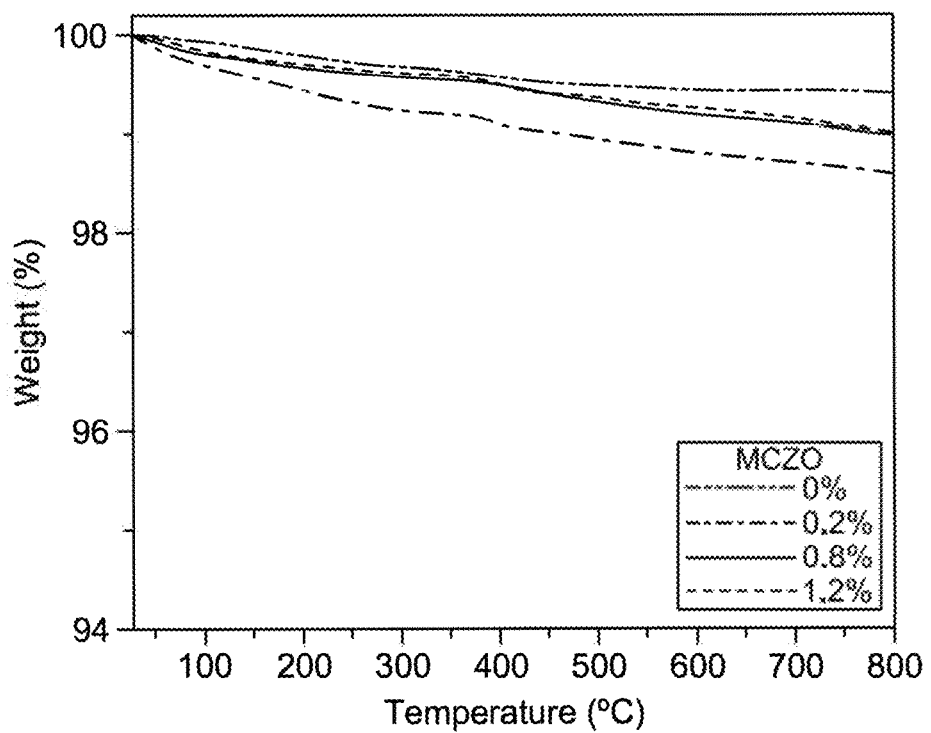
FIG. 7 is a thermogravimetric analysis (TGA) thermogram of the $Mn_xCo_{0.015}Zn_{1-x}O$ powder, according to certain embodiments.

The morphological studies were carried out using FESEM and TEM analysis. FIGS. 4A-4D shows that the nanoparticles exhibited a hexagonal disc shape. Moreover, the grains are distinct. The nanoparticles have an average diameter of 0.1 to 2 µm, preferably 0.5 to 1.5 µm. The EDS mapping was carried out for the elemental distribution (FIG. 5). The EDS layered image is depicted in FIG. 5A. EDS mapping shows the presence of Zn(FIG. 5B), O (FIG. 5C), Co (FIG. 5D), and Mn (FIG. 5E), which confirms the doping of Mn and Co. Moreover, the elements are uniformly distributed over the surface. The TEM images show that the size of the nanoparticle decreased with the rise in the content of Mn due to the Zener pinning effect (FIG. 6), where the size of Mn$^{2+}$ (0.065 nm) is smaller than that of Zn$^{2+}$ (0.072 nm). The TEM imaging was carried out for MCZO-0.2% (FIG. 6 Å), MCZO-0.8% (FIG. 6B), and MCZO-1.2% (FIG. 6C). The TGA profiles of the MCZO are shown in FIG. 7. The TGA studies show that the lowest weight loss is observed for the x=0 (0.63%). The greatest weight loss was observed for x=0.002 (1.45%). The weight loss is reduced for the high content of Mn (x=0.008 and 0.012). This may be due to the atomic packing factor (Table 1).

Optical and Photoluminescence Properties

Figure 8A:
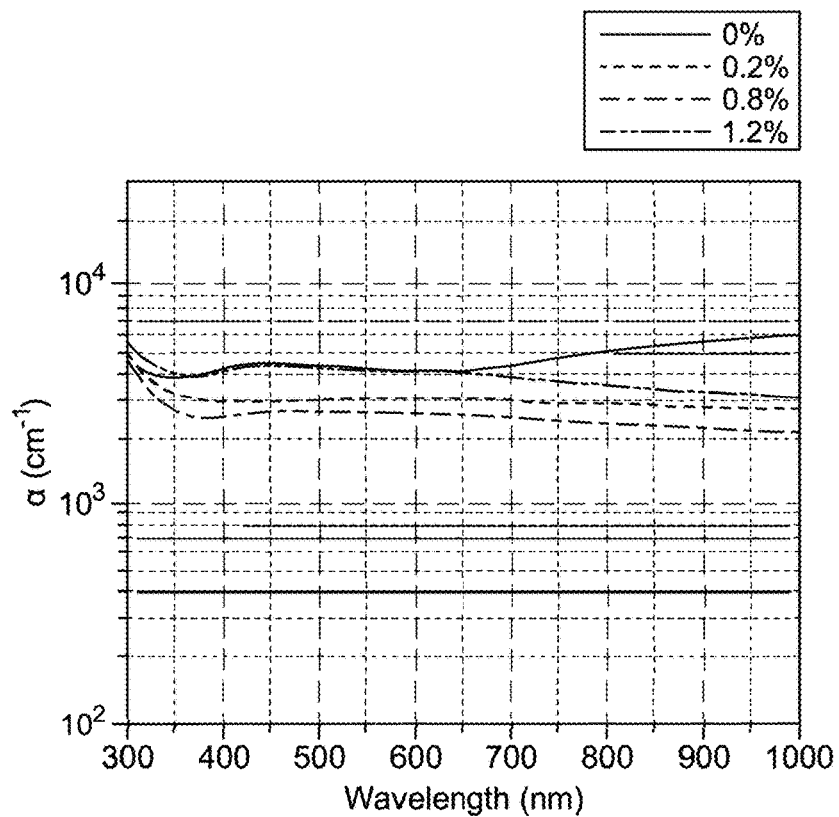
FIG. 8A is a plot depicting absorption coefficient of the $Mn_xCo_{0.015}Zn_{1-x}O$ powder, according to certain embodiments.
Figure 8B:
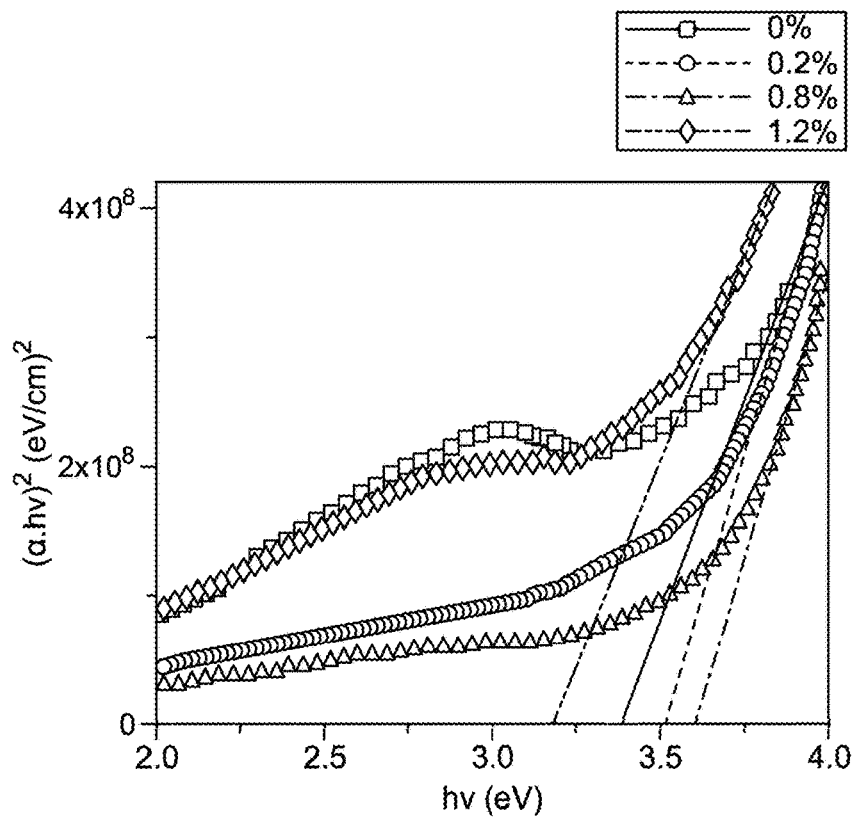
FIG. 8B is a Tauc's plot for determination of bandgap for the $Mn_xCo_{0.015}Zn_{1-x}O$ powder, according to certain embodiments.

For optoelectronic application, including solar cells, low absorption of the metal oxide is a factor. Absorption values were obtained for the MCZO layer coated on the glass substrate, FIG. 8A displays the absorption coefficient of the MCZO layer in the wavelength range of 300 to 1000 nm. It was observed that the absorption coefficient ($\alpha$) value gets reduced with increasing the Mn content up to 0.8%. The absorption coefficient is increased with a further increase of Mn. The bandgap ($E_g$) is determined using the Tauc plot (FIG. 8B). The obtained values of $E_g$ are 3.39, 3.52, 3.61, and 3.18 eV for x=0%, 0.2%, 0.8%, and 1.2%, respectively. This increment in the $E_g$ may be caused by the Moss-Burstein effect via blockage of the lowest states in the conduction band. The blockage of the lowest states may occur from states close to the conduction band being populated, which may support an increase in the bandgap. Further reduction in the $E_g$ may be due to many-body effects on the conduction and valence bands or the replacement of Zn$^{2+}$ by Mn$^{2+}$.

Figure 8C:
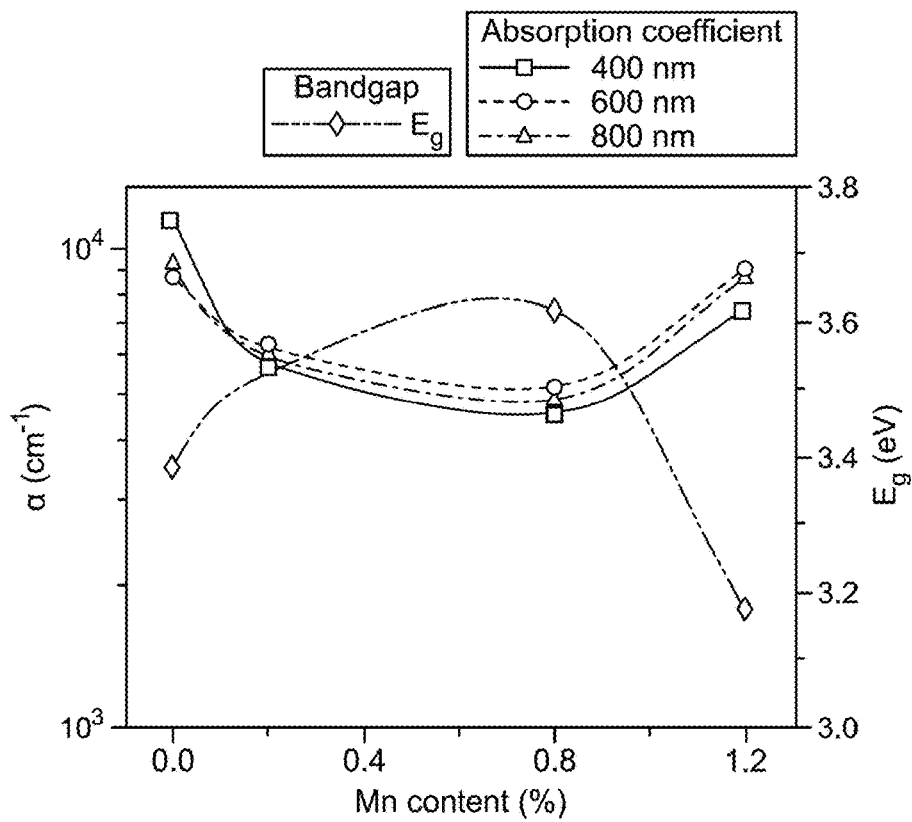
FIG. 8C is a plot showing absorption coefficient values at wavelengths of 400, 600, and 800 nm along with bandgap variation on the Mn content, according to certain embodiments.
Figure 8D:
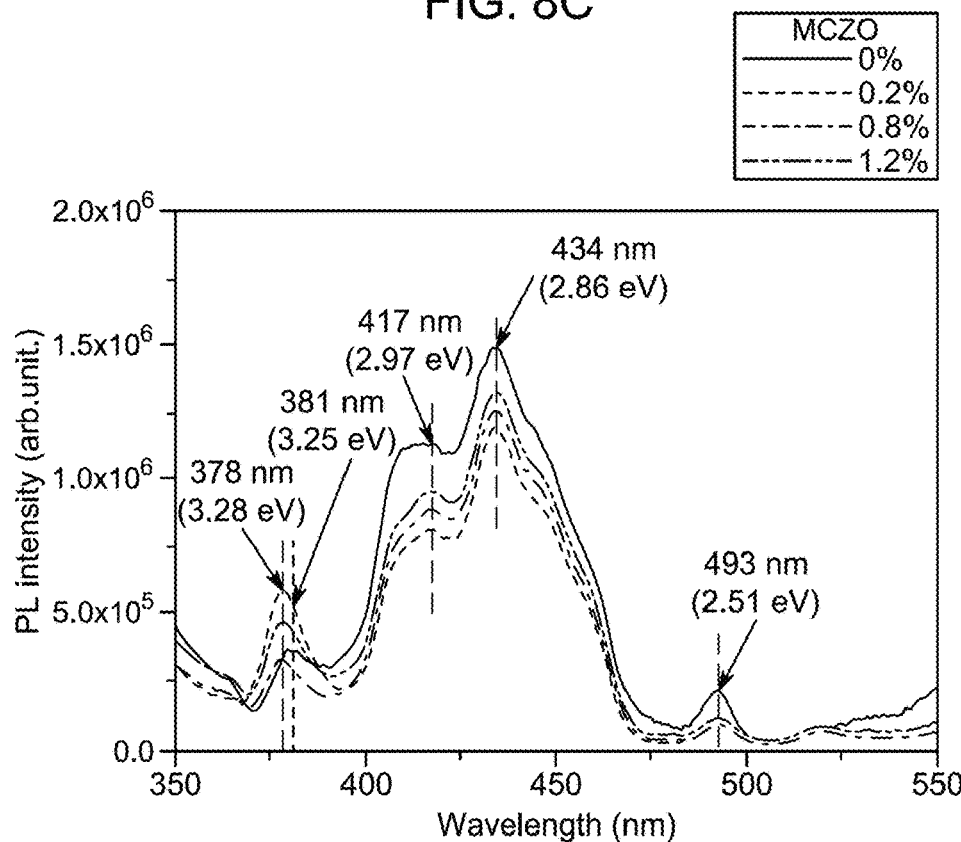
FIG. 8D shows photoluminescence (PL) spectra of the $Mn_xCo_{0.015}Zn_{1-x}O$, according to certain embodiments.
Figure 9A:
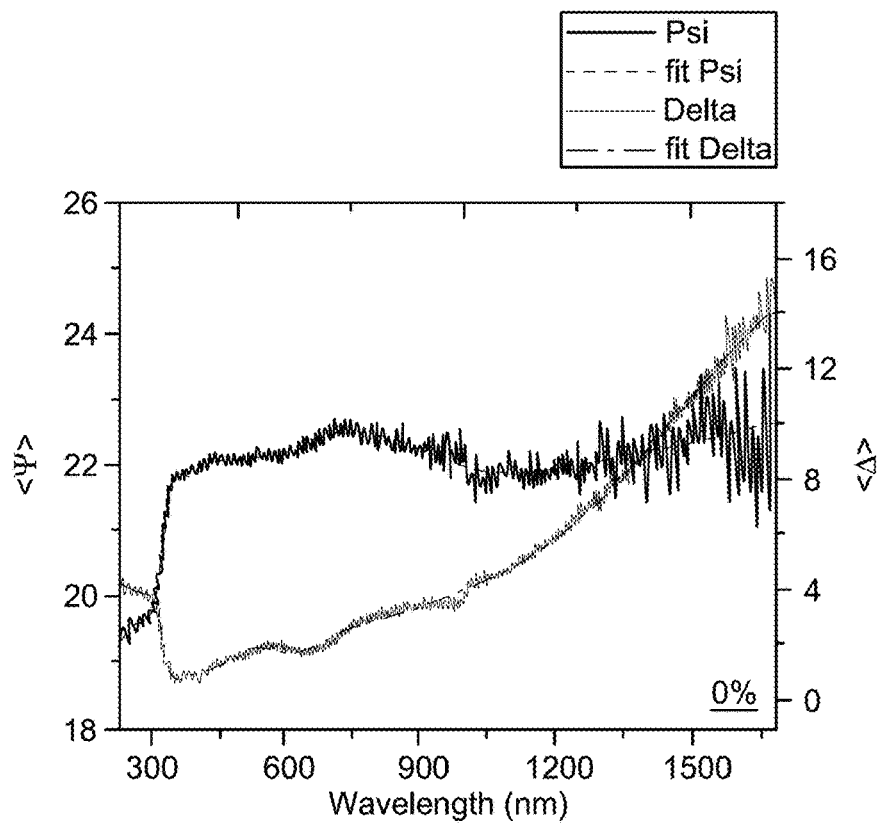
FIG. 9A shows an amplitude component (psi(ψ) in degree) and the phase difference (delta (Δ) in degree) values of $Mn_xCo_{0.015}Zn_{1-x}O$ layer coated on a glass substrate for x=0, according to certain embodiments.
Figure 9B:
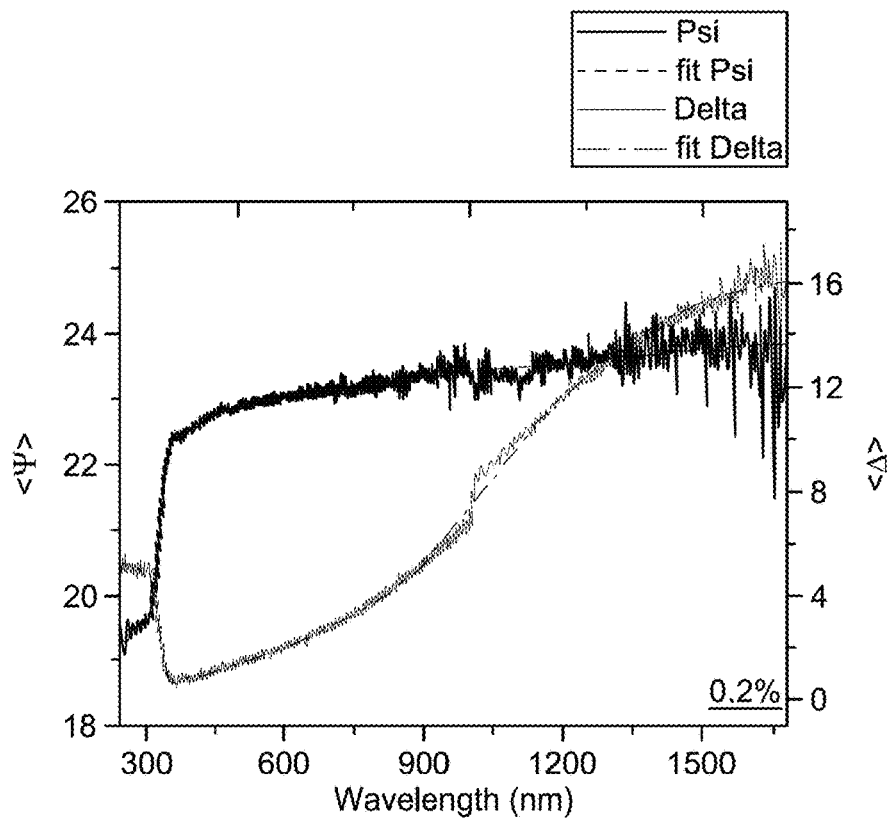
FIG. 9B shows an amplitude component (ψ in degree) and phase difference (Δ in degree) values of the $Mn_xCo_{0.015}Zn_{1-x}O$ layer coated on the glass substrate for x=0.002, according to certain embodiments.
Figure 9C:
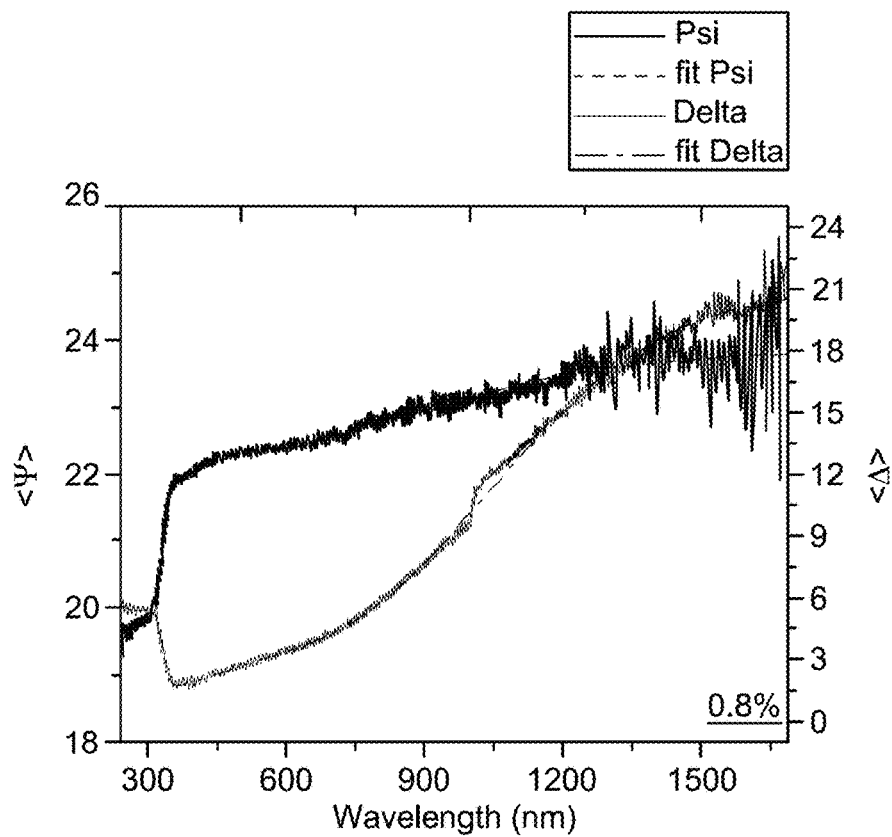
FIG. 9C shows an amplitude component (ψ in degree) and the phase difference (Δ in degree) values of the $Mn_xCo_{0.015}Zn_{1-x}O$ layer coated on the glass substrate for x=0.008, according to certain embodiments.
Figure 9D:
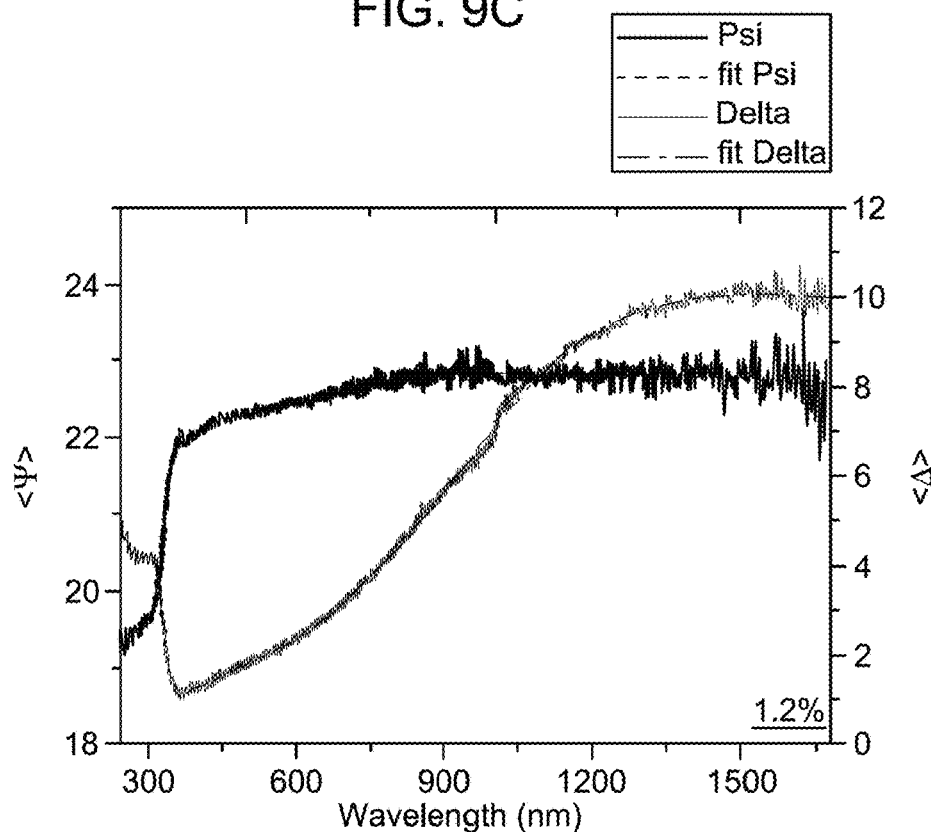
FIG. 9D shows an amplitude component (ψ in degree) and the phase difference (Δ in degree) values of the $Mn_xCo_{0.015}Zn_{1-x}O$ layer coated on the glass substrate for x=0.012, according to certain embodiments.
Figure 10A:
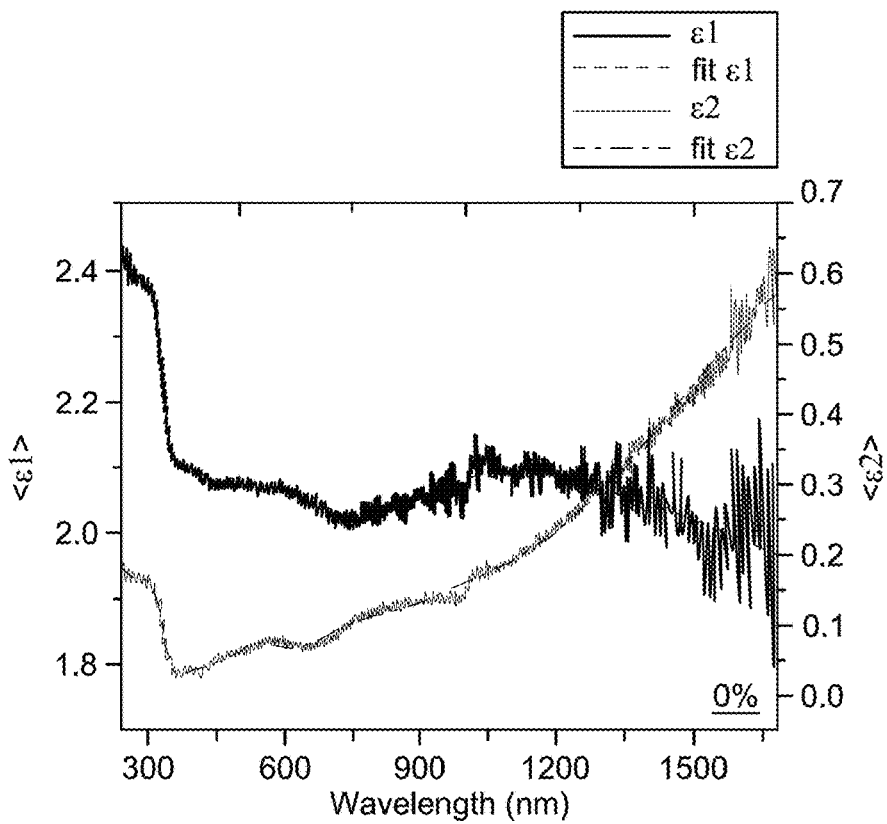
FIG. 10A shows real (ε1) and imaginary (ε2) parts of dielectric constants of the $Mn_xCo_{0.015}Zn_{1-x}O$ layer coated on the glass substrate for x=0, according to certain embodiments.
Figure 10B:
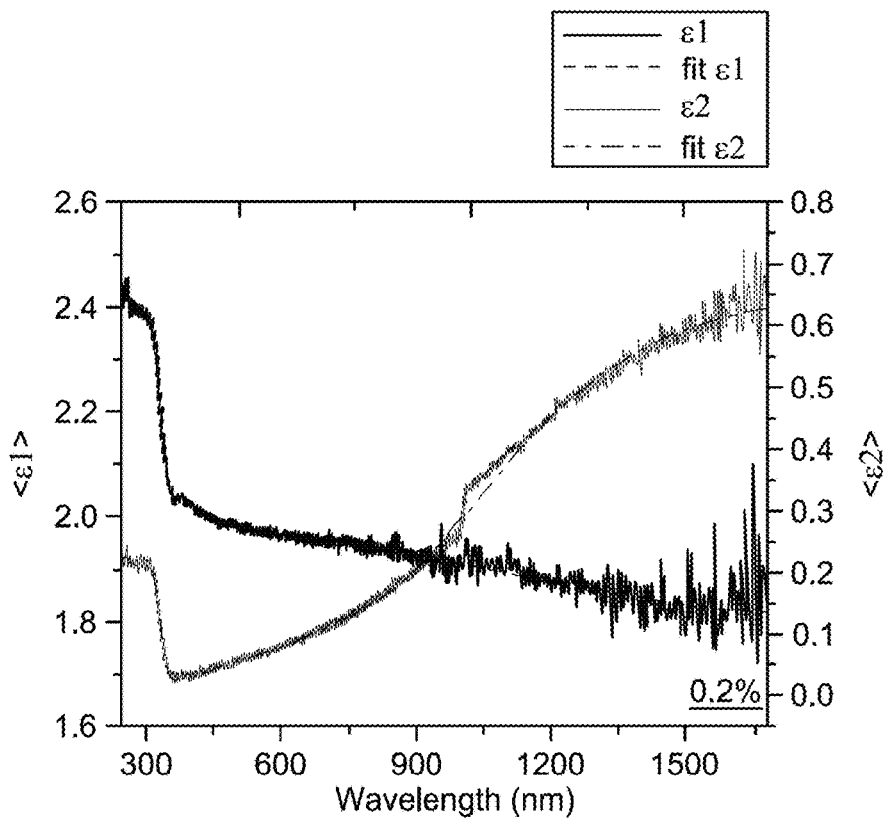
FIG. 10B shows ε1 and ε2 parts of dielectric constants of the $Mn_xCo_{0.015}Zn_{1-x}O$ layer coated on the glass substrate for x=0.002, according to certain embodiments.
Figure 10C:
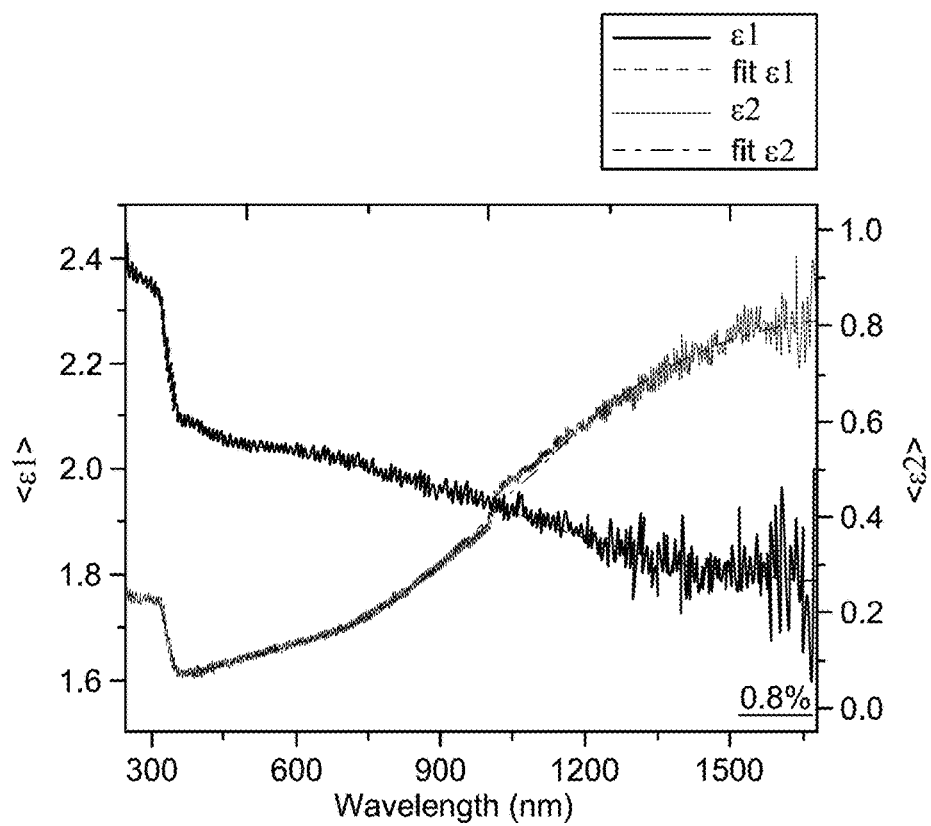
FIG. 10C shows ε1 and ε2 parts of dielectric constants of the $Mn_xCo_{0.015}Zn_{1-x}O$ layer coated on the glass substrate for x=0.008, according to certain embodiments.
Figure 10D:
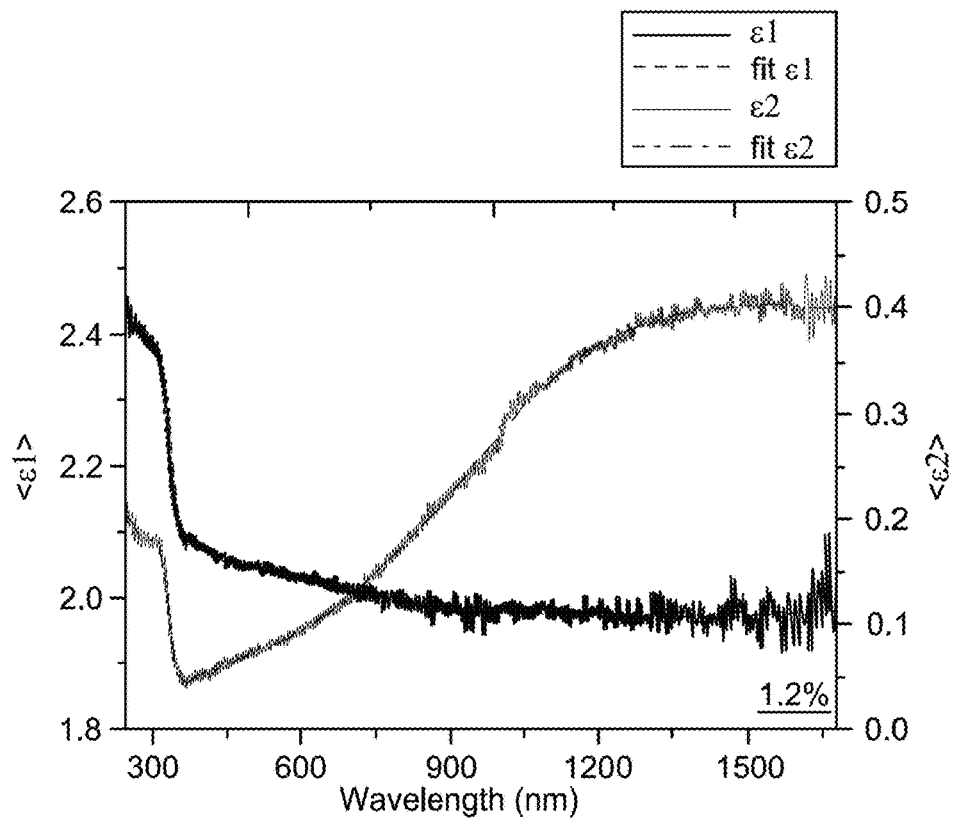
FIG. 10D shows ε1 and ε2 parts of dielectric constants of the $Mn_xCo_{0.015}Zn_{1-x}O$ layer coated on the glass substrate for x=0.012, according to certain embodiments.
Figure 11A:
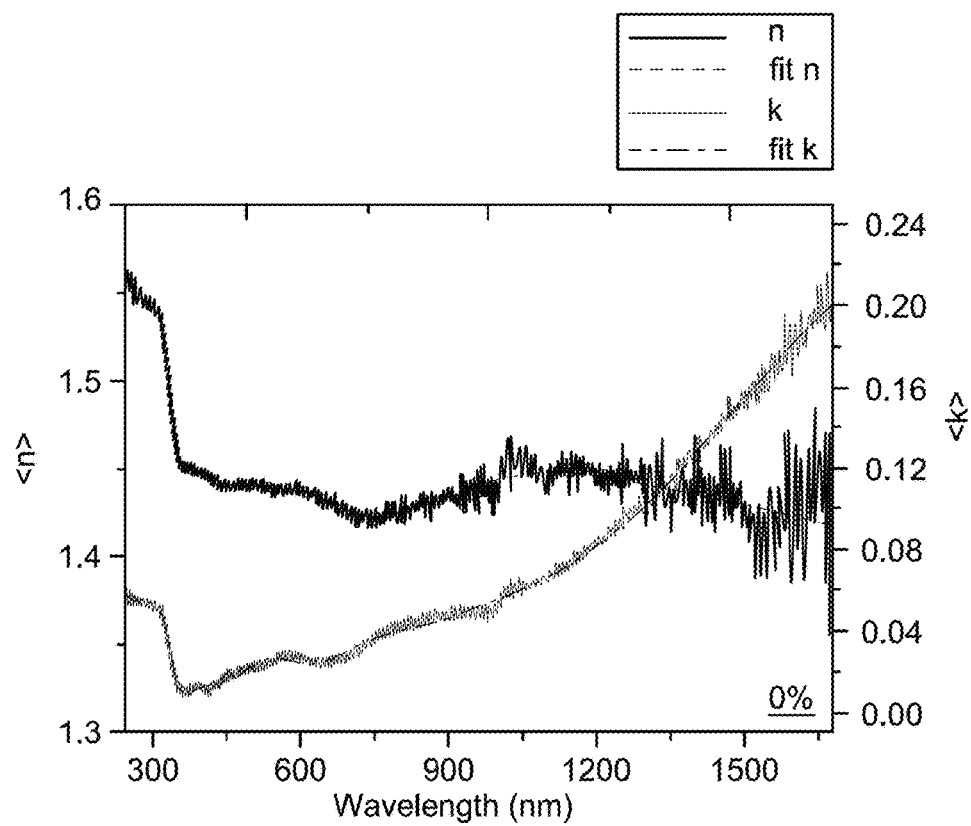
FIG. 11A shows real (n) and imaginary (k) parts of an optical constant (refractive index) of the $Mn_xCo_{0.015}Zn_{1-x}O$ layer coated on the glass substrate for x=0, according to certain embodiments.
Figure 11B:
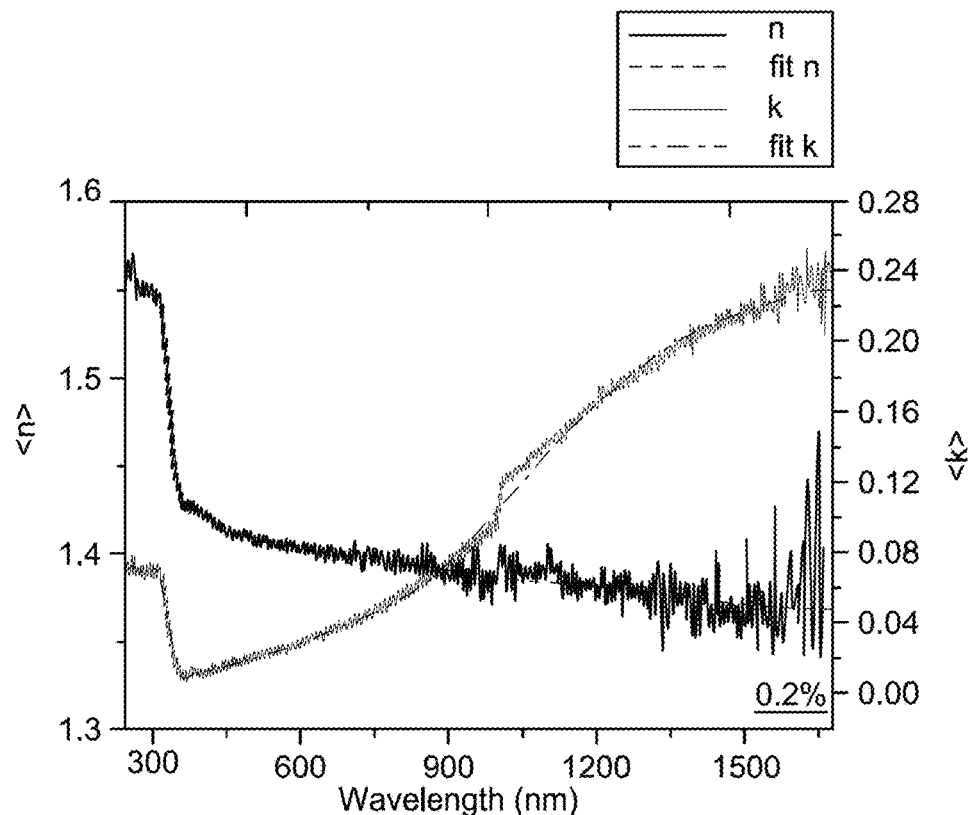
FIG. 11B shows n and k parts of an optical constant (refractive index) of the $Mn_xCo_{0.015}Zn_{1-x}O$ layer coated on the glass substrate for x=0.002, according to certain embodiments.
Figure 11C:
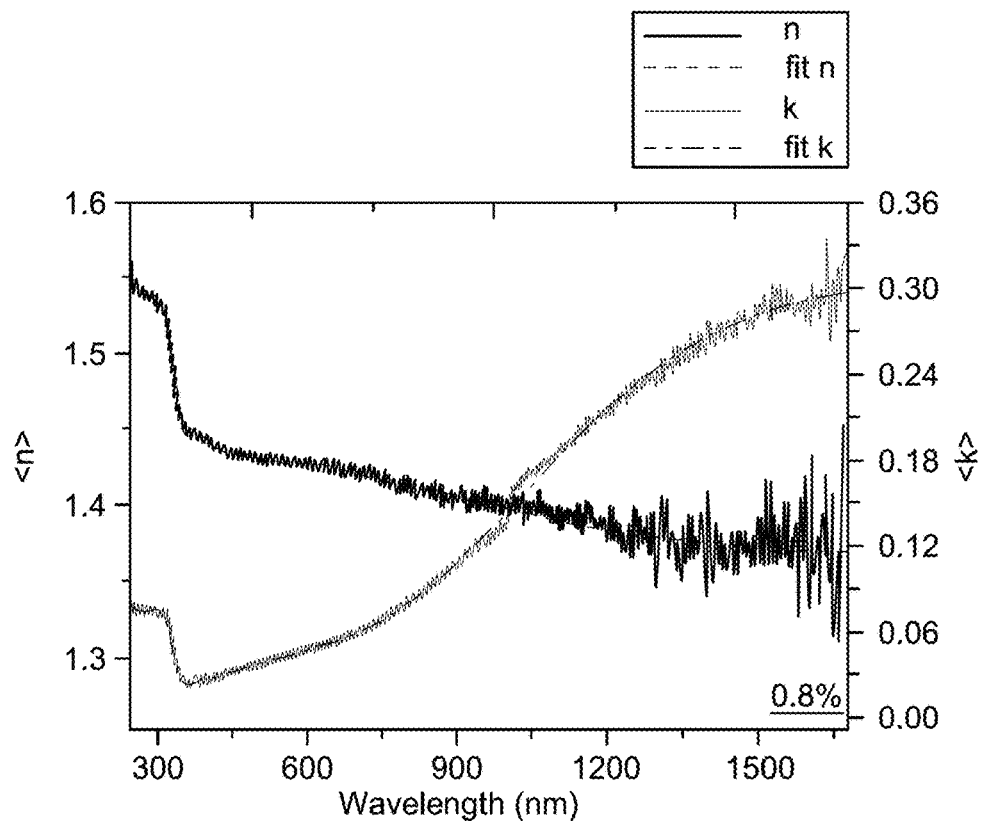
FIG. 11C shows n and k parts of an optical constant (refractive index) of the $Mn_xCo_{0.015}Zn_{1-x}O$ layer coated on the glass substrate for x=0.008, according to certain embodiments.
Figure 11D:
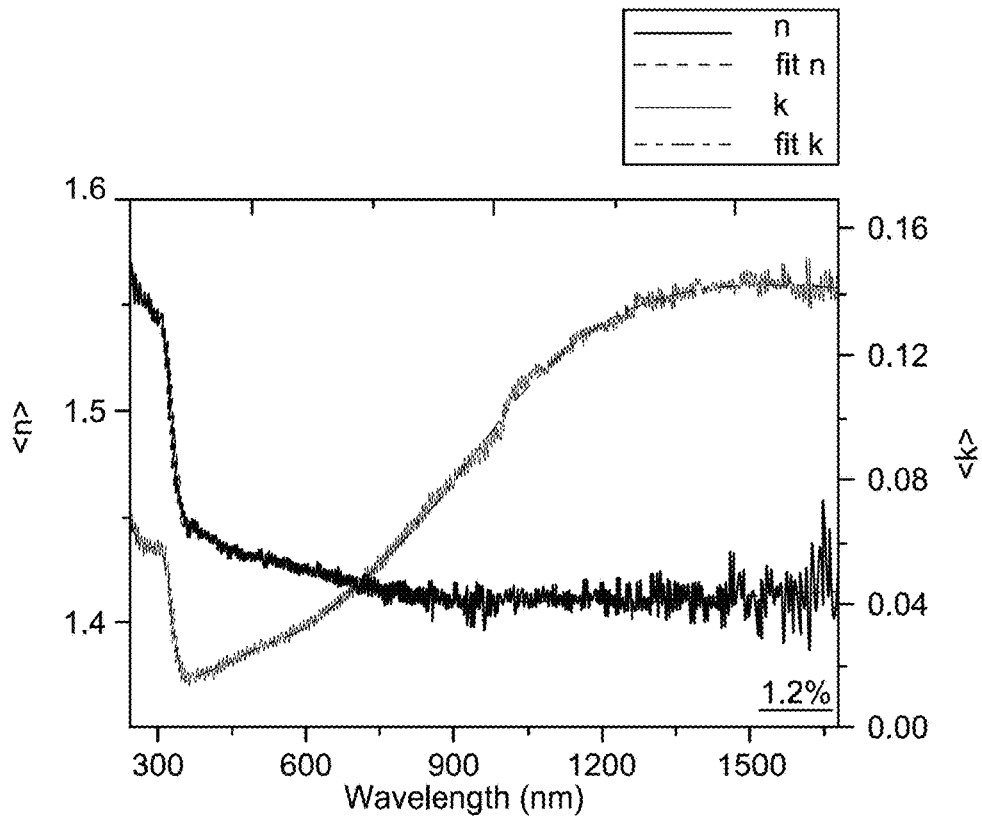
FIG. 11D shows n and k parts of an optical constant (refractive index) of the $Mn_xCo_{0.015}Zn_{1-x}O$ layer coated on the glass substrate for x=0.012, according to certain embodiments.

An opposite result was obtained for Ag and Al co-doped ZnO films. The absorption coefficient values obtained at $\lambda$=400 nm for x=0%, 0.2%, 0.8%, and 1.2% are 1.20×10$^4$, 6.20×10$^4$, 4.83×10$^4$, and 7.91×10$^4$ cm$^{-1}$, respectively. The absorption coefficient values at $\lambda$=600 nm are increased for each sample and are slightly decreased at $\lambda$=800 nm. The dependency of the absorption coefficient on Mn doping content for $\lambda$=400, 800, and 1200 nm is illustrated in FIG. 8C. At each wavelength, the absorption coefficient reduces up to x=0.8%, which is increased with further increasing x. These results support that a higher content of Mn is better for optoelectronic devices. Furthermore, the photoluminescent (PL) analysis was used to investigate the crystalline quality and the defects (FIG. 8D). Four main peaks are observed for x=0 at 381, 417, 434, and 493 nm. The peak at 381 nm is due to the band-to-band transition in a zinc oxide near band-edge emission (NBE). The most intense peak at 434 nm is related to zinc interstitial ($Zn_i$), which arises due to the transition from the donor level of $Zn_i$ to the balance band. This peak intensity is first reduced for x=0.2% and increased for higher Mn content. The PL peak arises at 493 nm (blue-green region) due to oxygen vacancy. The intensity of each peak, except NBE, is first reduced for Mn content of x=0.2%, and further strengthened with an increasing Mn content.

Figure 12A:
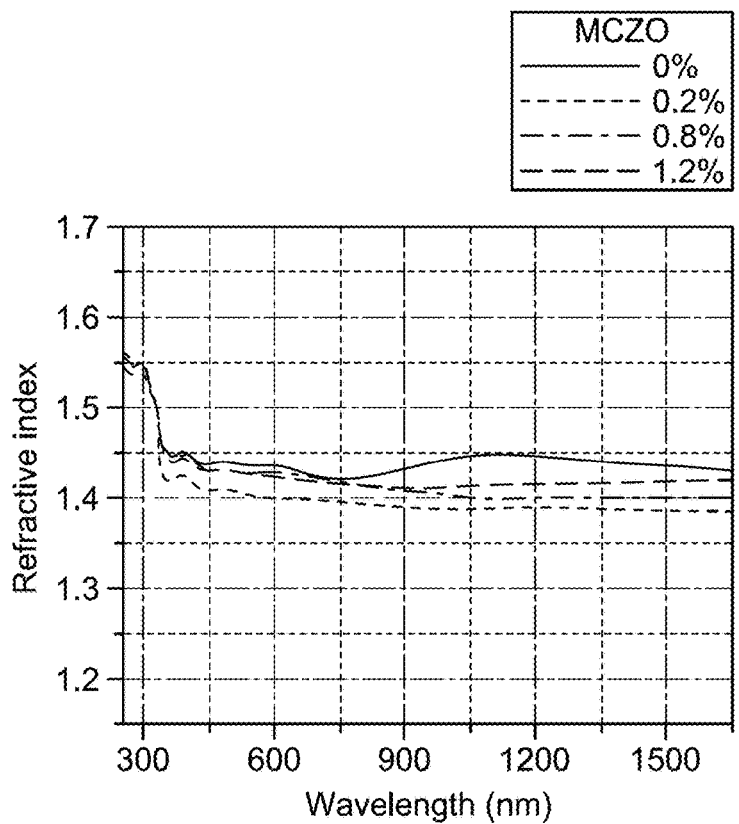
FIG. 12A shows a refractive index of the $Mn_xCo_{0.015}Zn_{1-x}O$ powder as a function of wavelength, according to certain embodiments.
Figure 12B:
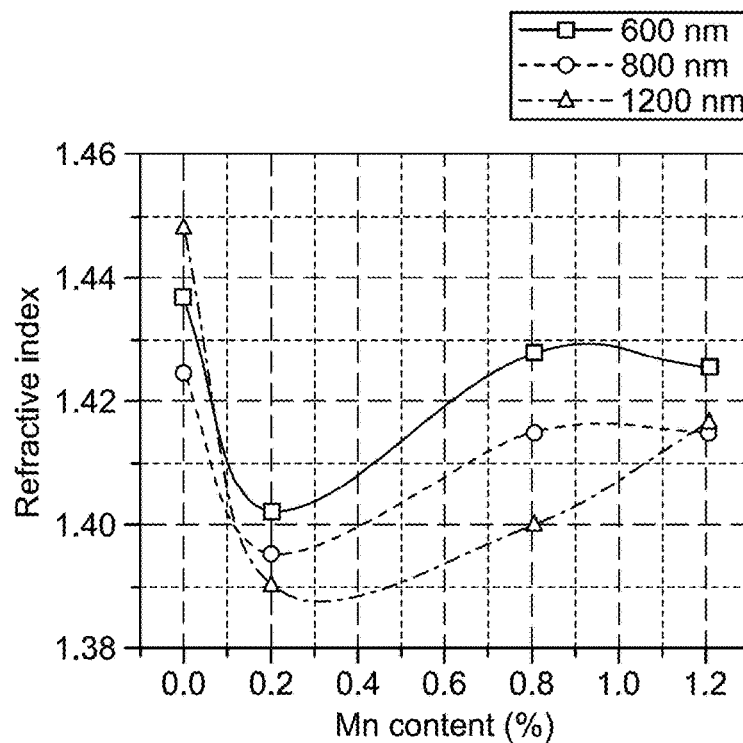
FIG. 12B shows a comparison of refractive index at wavelengths of 600, 800, and 1200 nm, according to certain embodiments.

Ellipsometry measurement is conducted to obtain optical constants of the MCZO layers. Furthermore, the experimental curves were fitted with models using "CompleteEASE" software. For the modeling, a bilayer system was considered. The discrepancy was minimized using the Levenberg-Marquardt algorithm. The variation of the amplitude (Psi ($\psi$)) and phase (Delta ($\Delta$)) with wavelength ($\lambda$) is illustrated in FIGS. 9A-9D. For x=0 and 1.2%, the value of $\psi$ initially increased at the lower $\lambda$ range. However, it is almost constant for $\lambda$>370 nm. For the Mn-doped samples (x=0.2 and 0.8), the value of $\psi$ slightly increased in the $\lambda$ range of 370 to 1700 nm. The value of $\Delta$ first declined and then grew to the maximal value at $\lambda$=1700 nm. FIGS. 10A-10D illustrate the dependency of real ($\epsilon$1) and imaginary ($\epsilon$2) parts of the dielectric constant on k. The value of $\epsilon$1 is initially reduced at a fast rate in $\lambda$<370 nm, and then a slight reduction of the value of $\epsilon$1 was observed for the $\lambda$ range of 370 to 1700 nm. The $\epsilon$2 is first decreased and then rises to the highest value at $\lambda$=1700 nm. FIGS. 11A-11D illustrate the dependency of real (n) and imaginary (k) parts of the refractive index on wavelength. The resultant of the real and imaginary parts of the refractive index ($\mu$=n+ik) was obtained by the sum of the square of the real and imaginary parts. The resultant refractive index vs. $\lambda$ is displayed in FIG. 12A. The MCZO sample with x=0% offers the highest values of $\mu(\lambda)$ in the $\lambda$ range of 370 to 1700 nm. The $\mu(\lambda)$ in the range of 370 to 1700 nm is decreased for x=0.2%, and the refractive index value increases again with increasing Mn content. The variation of the refractive index at $\lambda$=600, 800, and 1200 nm is shown in FIG. 12B. The value of $\mu$=1.437, 1.402, 1.428, and 1.426 for x=0, 0.2, 0.8, and 1.2%, respectively.

To this end, hexagonal nanosheets of $Mn_xCo_{0.015}Zn_{1-x}O$ (x=0, 0.002, 0.008, and 0.012) were synthesized using a hydrothermal process. The TEM analysis support that the size of the nanosheets was reduced with increasing the content of Mn. Furthermore, the influence of Mn doping on the optical and photoluminescence properties of $Mn_xCo_{0.015}Zn_{1-x}O$ (x=0, 0.002, 0.008, and 0.012) hexagonal nanosheets were investigated. XRD results revealed that the inter-planar spacing, cell parameters, unit cell volume, lattice strain, and dislocation density were at a maximum for the Mn content of 0.2%. The acquired values of $E_g$ are 3.39, 3.52, 3.61, and 3.18 eV for x=0%, 0.2%, 0.8%, and 1.2%, respectively. The absorption coefficient values obtained at $\lambda$=400 nm are $1.20\times10^4$, $6.20\times10^4$, $4.83\times10^4$, and $7.91\times10^4$ $cm^{-1}$ for x=0, 0.2, 0.8, and 1.2%, respectively. The absorption at) $\lambda$=600 nm is increased for all the samples, which is then slightly decreased at $\lambda$=800 nm. The obtained refractive indices for x=0, 0.2, 0.8, and 1.2% are 1.437, 1.402, 1.428, and 1.426, respectively. These results are indicative of $Mn_xCo_{0.015}Zn_{1-x}O$ with x=0.8% for use in an electron transport layer for perovskite solar cells.

Numerous modifications and variations of the present disclosure are possible in light of the above teachings. It is, therefore, to be understood that, within the scope of the appended claims, the present disclosure may be practiced otherwise than as specifically described herein.

The invention claimed is:

1. A mesoscopic inverted perovskite solar cell, comprising:
   in the following order, an electrode layer, an electron transport layer, a perovskite layer, a mesoporous layer, a hole transport layer, and a metal oxide layer:
   wherein the electrode layer is a top layer, and the perovskite layer is between the hole transport layer and the electron transport layer;
   wherein the electron transport layer comprises an electron transport material; and
   wherein the electron transport material comprises:
   a metal co-doped zinc oxide compound having a formula $Mn_xCo_{0.015}Zn_{1-x}$, wherein x has a value in a range of 0.001 to 0.014.

2. The mesoscopic inverted perovskite solar cell of claim 1, wherein the metal co-doped zinc oxide compound is made by a process comprising:
   dissolving a zinc salt to form an aqueous mixture;
   adding a manganese salt, a cobalt salt, and a sodium hydroxide solution to the aqueous mixture;
   reacting the aqueous mixture in an autoclave to form nanoparticles;
   washing the nanoparticles and isolating the nanoparticles and drying the nanoparticles; then
   annealing the nanoparticles in a furnace to form the metal co-doped zinc oxide compound.

3. The mesoscopic inverted perovskite solar cell of claim 2, wherein the process of making the metal co-doped zinc oxide compound the autoclave is at a temperature of 150 to 200° C. during the reacting for a time of 2 to 6 hours.

4. The mesoscopic inverted perovskite solar cell of claim 2, wherein the process of making the metal co-doped zinc oxide compound the furnace is at a temperature of 250 to 300° C. during the annealing for a time of 1 to 4 hours.

5. The mesoscopic inverted perovskite solar cell of claim 1, wherein the electron transport layer is an electron transport film comprising the electron transport material, wherein the electron transport film is made by a process comprising:
   dispersing the metal co-doped zinc oxide compound in an organic solvent to form a product-containing suspension; and
   depositing the product-containing suspension on a glass substrate.

6. The mesoscopic inverted perovskite solar cell of claim 1, wherein the metal co-doped zinc oxide compound is in the form of granular nanoparticles.

7. The mesoscopic inverted perovskite solar cell of claim 6, wherein the granular nanoparticles have a hexagonal disc shape.

8. The mesoscopic inverted perovskite solar cell of claim 6, wherein the granular nanoparticles have an average particle diameter of 0.1 to 2 μm.

9. The mesoscopic inverted perovskite solar cell of claim 1, wherein the metal co-doped zinc oxide compound has an inter-planar spacing of 2.460 to 2.480 Å.

10. The mesoscopic inverted perovskite solar cell of claim 1, wherein the metal co-doped zinc oxide compound has an atomic packing fraction of 0.51650 to 0.51950.

11. The mesoscopic inverted perovskite solar cell of claim 1, wherein the metal co-doped zinc oxide compound has a unit cell volume of 47.120 to 47.360 Å$^3$.

12. The mesoscopic inverted perovskite solar cell of claim 1, wherein the metal co-doped zinc oxide compound has a lattice strain of $2.50\times10^{-3}$ to $3.15\times10^{-3}$.

13. The mesoscopic inverted perovskite solar cell of claim 1, wherein the metal co-doped zinc oxide compound has a dislocation density of $5.4000\times10^{-6}$ to $7.6000\times10^{-6}$ 1/Å$^2$.

14. The mesoscopic inverted perovskite solar cell of claim 1, wherein the metal co-doped zinc oxide compound has a bandgap (Eg) with a value of 3.00 to 3.80 eV.

15. The mesoscopic inverted perovskite solar cell of claim 1, wherein x is 0.008, and the metal co-doped zinc oxide compound has a bandgap (Eg) with a value of 3.55 to 3.75 eV.

16. The mesoscopic inverted perovskite solar cell of claim 1, wherein the metal co-doped zinc oxide compound has an absorption coefficient with a value of $1.00\times10^4$ to $8.50\times10^4$ $cm^{-1}$ at a wavelength value of 400 nm.

17. The mesoscopic inverted perovskite solar cell of claim 1, wherein x is 0.008, and the metal co-doped zinc oxide compound has an absorption coefficient with a value of $4.50\times10^4$ to $5.00\times10^4$ $cm^{-1}$ at a wavelength value of 400 nm.

18. The mesoscopic inverted perovskite solar cell of claim 1, wherein the metal co-doped zinc oxide compound has a refractive index with a value of 1.350 to 1.500 at a wavelength of 600 nm.

19. The mesoscopic inverted perovskite solar cell of claim 1, wherein x is 0.008, the metal co-doped zinc oxide compound has a refractive index with a value of 1.420 to 1.435 at a wavelength of 600 nm.

* * * * *